(12) United States Patent  (10) Patent No.: US 8,515,291 B2
Inoue  (45) Date of Patent: Aug. 20, 2013

(54) LIGHT RECEIVING DEVICE AND LIGHT RECEIVING METHOD

(75) Inventor: Tadao Inoue, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 560 days.

(21) Appl. No.: 12/540,855

(22) Filed: Aug. 13, 2009

(65) Prior Publication Data
US 2009/0304397 A1  Dec. 10, 2009

Related U.S. Application Data

(63) Continuation of application No. PCT/JP2007/000248, filed on Mar. 16, 2007.

(51) Int. Cl.
| | | |
|---|---|---|
| H04B 10/06 | (2011.01) | |
| G01J 1/20 | (2006.01) | |
| G02B 7/04 | (2006.01) | |
| G02B 27/64 | (2006.01) | |

(52) U.S. Cl.
USPC ........... 398/202; 398/212; 398/213; 398/214; 250/202; 250/201.1; 250/201.2; 250/201.7

(58) Field of Classification Search
USPC ........... 398/202–214; 250/202–201.2, 201.6, 250/203.1
See application file for complete search history.

(56) References Cited

U.S. PATENT DOCUMENTS

| | | | | |
|---|---|---|---|---|
| 4,942,473 | A * | 7/1990 | Zeevi et al. | 348/281 |
| 5,387,972 | A * | 2/1995 | Janz et al. | 356/477 |
| 5,864,362 | A * | 1/1999 | Cutler | 348/96 |
| 6,310,880 | B1 * | 10/2001 | Waller | 370/400 |
| 7,039,326 | B1 * | 5/2006 | Chung | 398/202 |
| 7,058,316 | B2 * | 6/2006 | Vilnrotter et al. | 398/202 |
| 7,085,502 | B2 * | 8/2006 | Shushakov et al. | 398/202 |
| 7,323,673 | B1 * | 1/2008 | Ake et al. | 250/214 R |
| 7,532,825 | B2 * | 5/2009 | Kinoshita | 398/202 |
| 2002/0018600 | A1 * | 2/2002 | Lyon et al. | 382/305 |
| 2002/0176606 | A1 * | 11/2002 | Wernet et al. | 382/107 |
| 2003/0081134 | A1 * | 5/2003 | Luo et al. | 348/308 |
| 2004/0208439 | A1 * | 10/2004 | Bell et al. | 385/32 |
| 2005/0041296 | A1 * | 2/2005 | Hsiao et al. | 359/619 |
| 2007/0009248 | A1 * | 1/2007 | Subbotin | 396/121 |
| 2009/0079862 | A1 * | 3/2009 | Subbotin | 348/345 |
| 2009/0304397 | A1 * | 12/2009 | Inoue | 398/202 |

FOREIGN PATENT DOCUMENTS

| | | |
|---|---|---|
| JP | 01-138751 A | 5/1989 |
| JP | 06-350800 A | 12/1994 |
| JP | 09-509494 A | 9/1997 |
| JP | 10-22918 A | 1/1998 |
| JP | 10-93358 A | 4/1998 |
| JP | 2003-258736 A | 9/2003 |
| JP | 2006-191313 A | 7/2006 |
| WO | WO 95/23348 A1 | 8/1995 |

* cited by examiner

Primary Examiner — Nathan Curs
Assistant Examiner — Tanya Ngo
(74) Attorney, Agent, or Firm — Fujitsu Patent Center

(57) ABSTRACT

The light receiving device includes a pixel array, such as a two-dimensional pixel array, of pixels each having a light-receiving element for receiving input signal light, an output selecting unit for selecting the outputs of pixels within the pixel array, a selected output adding unit for adding and outputting the selected outputs of the pixels, and an amplifying unit for amplifying the output of the selected output adding unit.

15 Claims, 29 Drawing Sheets

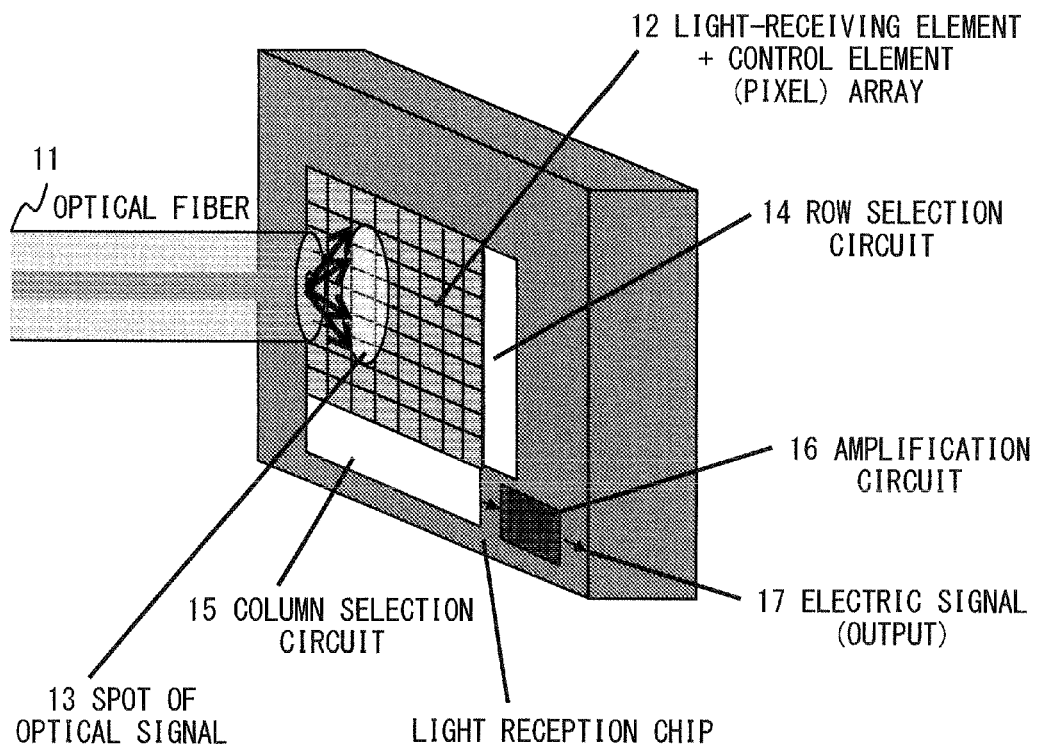
F I G. 3

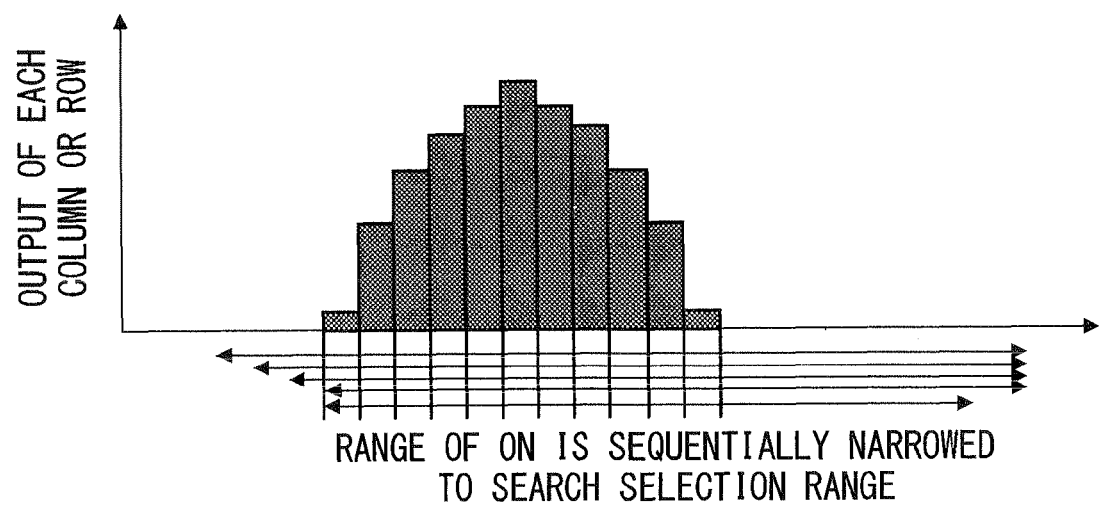
F I G. 8

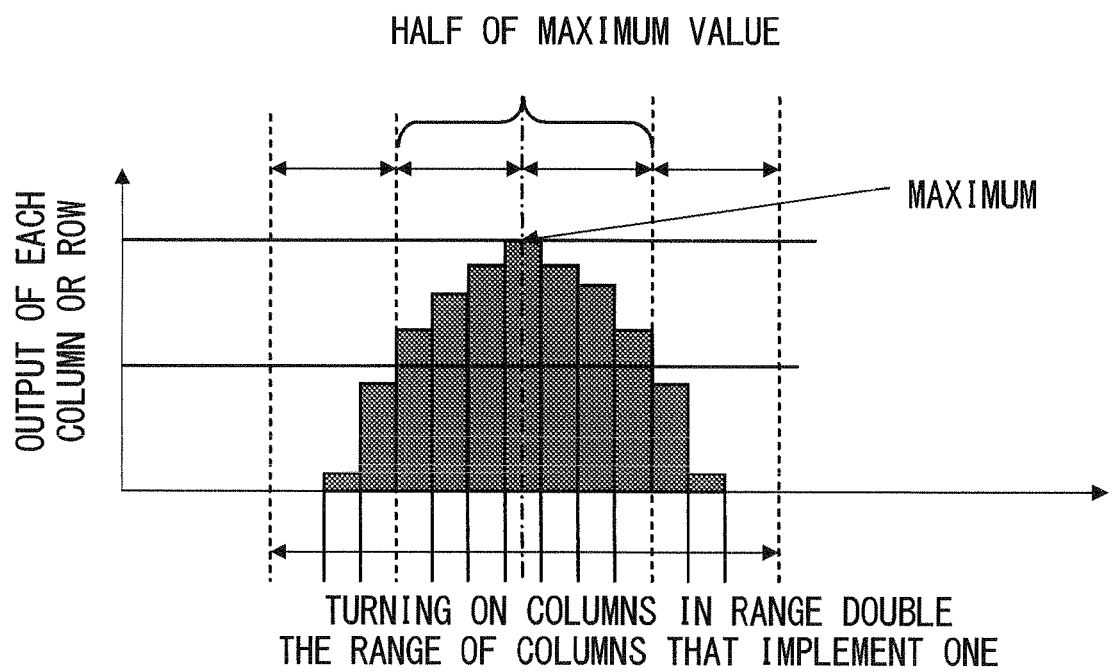
F I G. 1 4

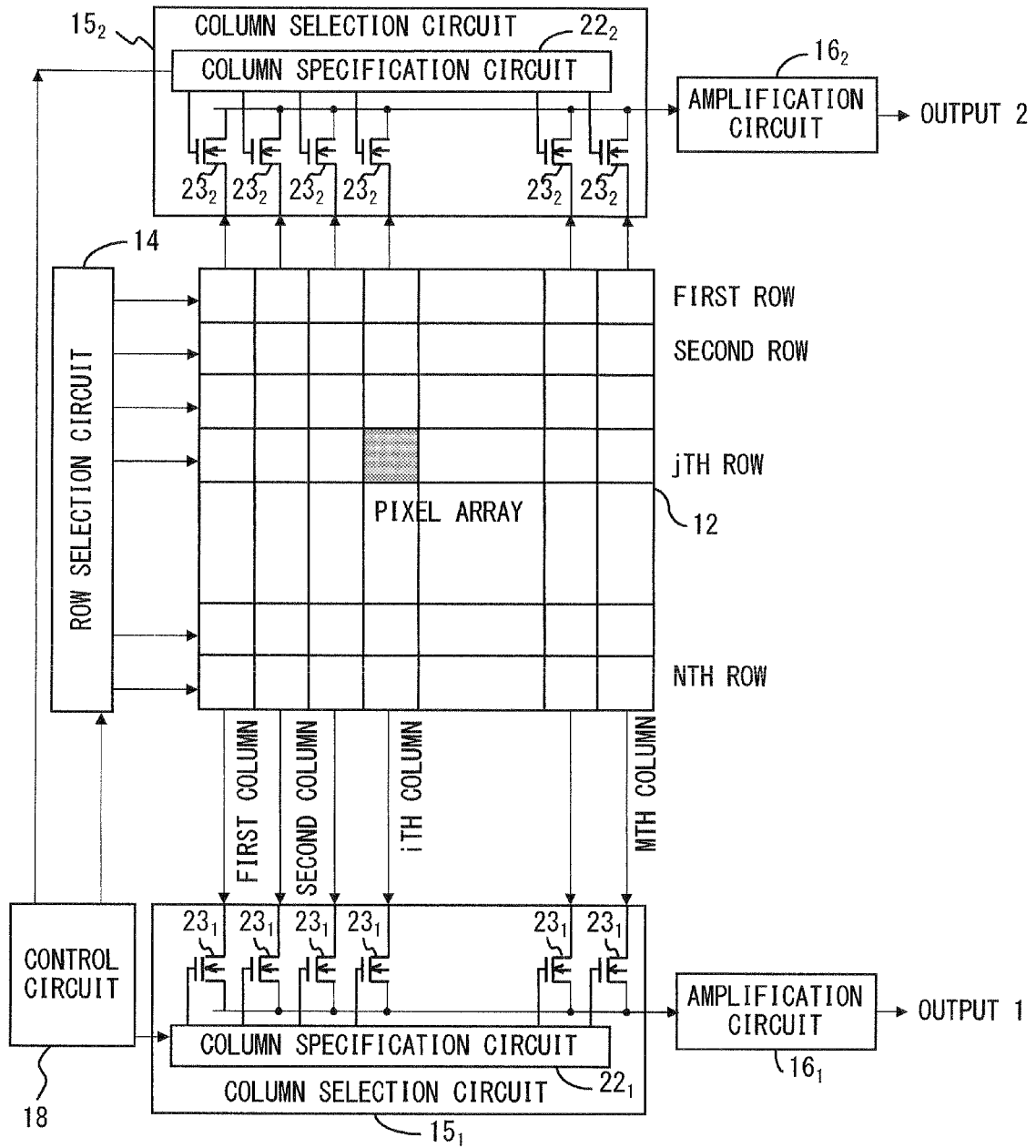
F I G. 15

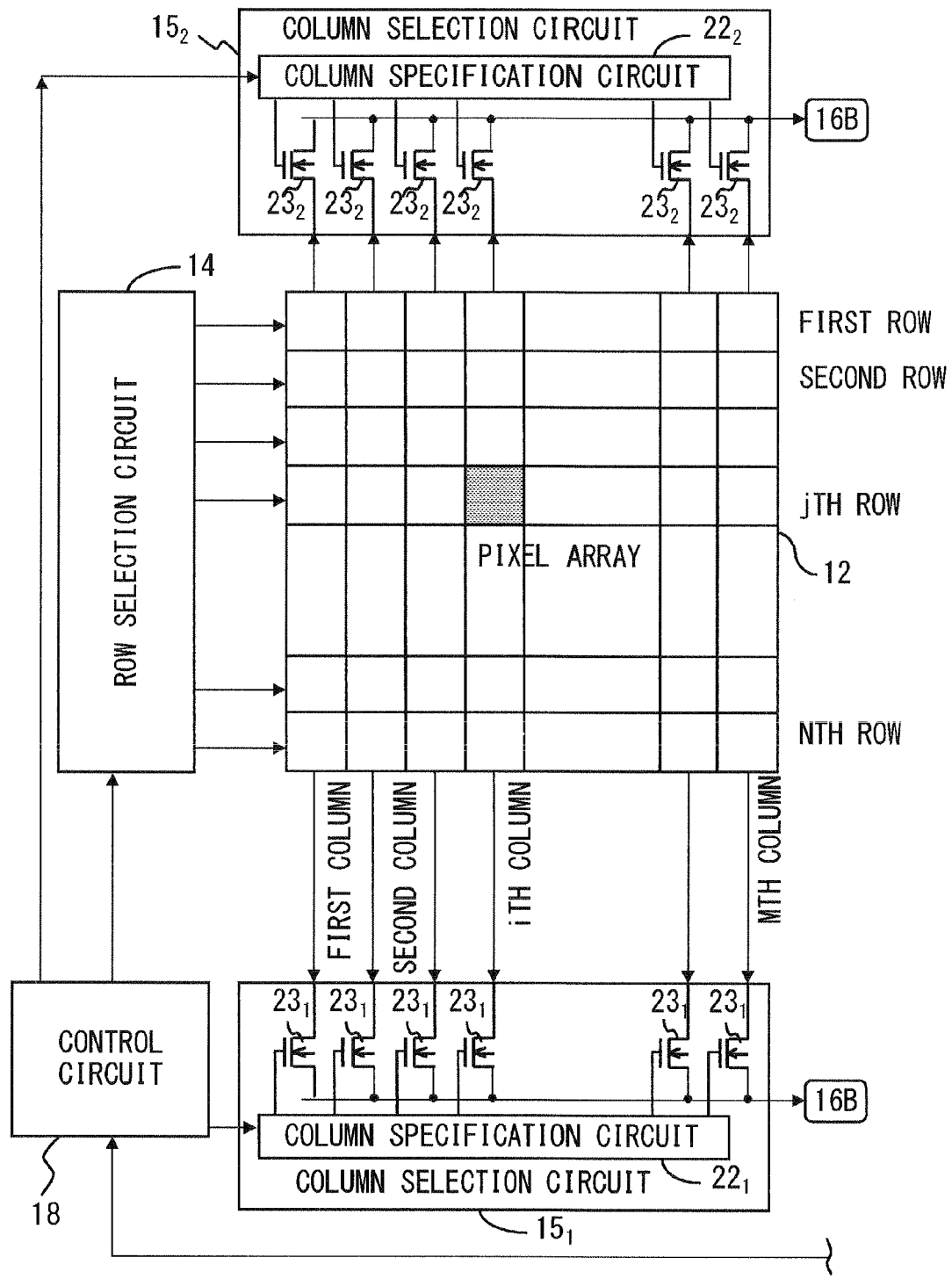
F I G. 16A

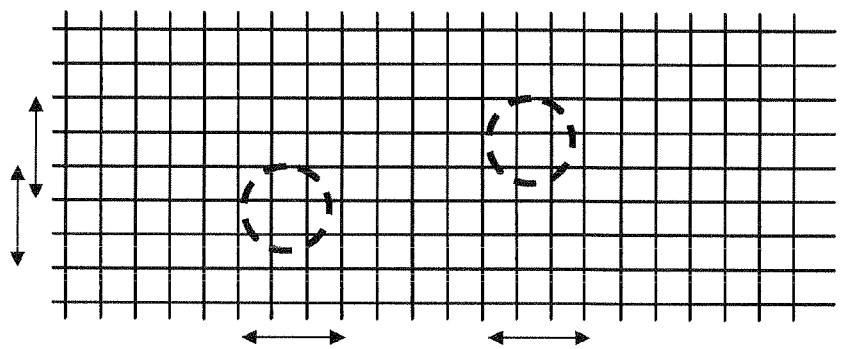
F I G. 19

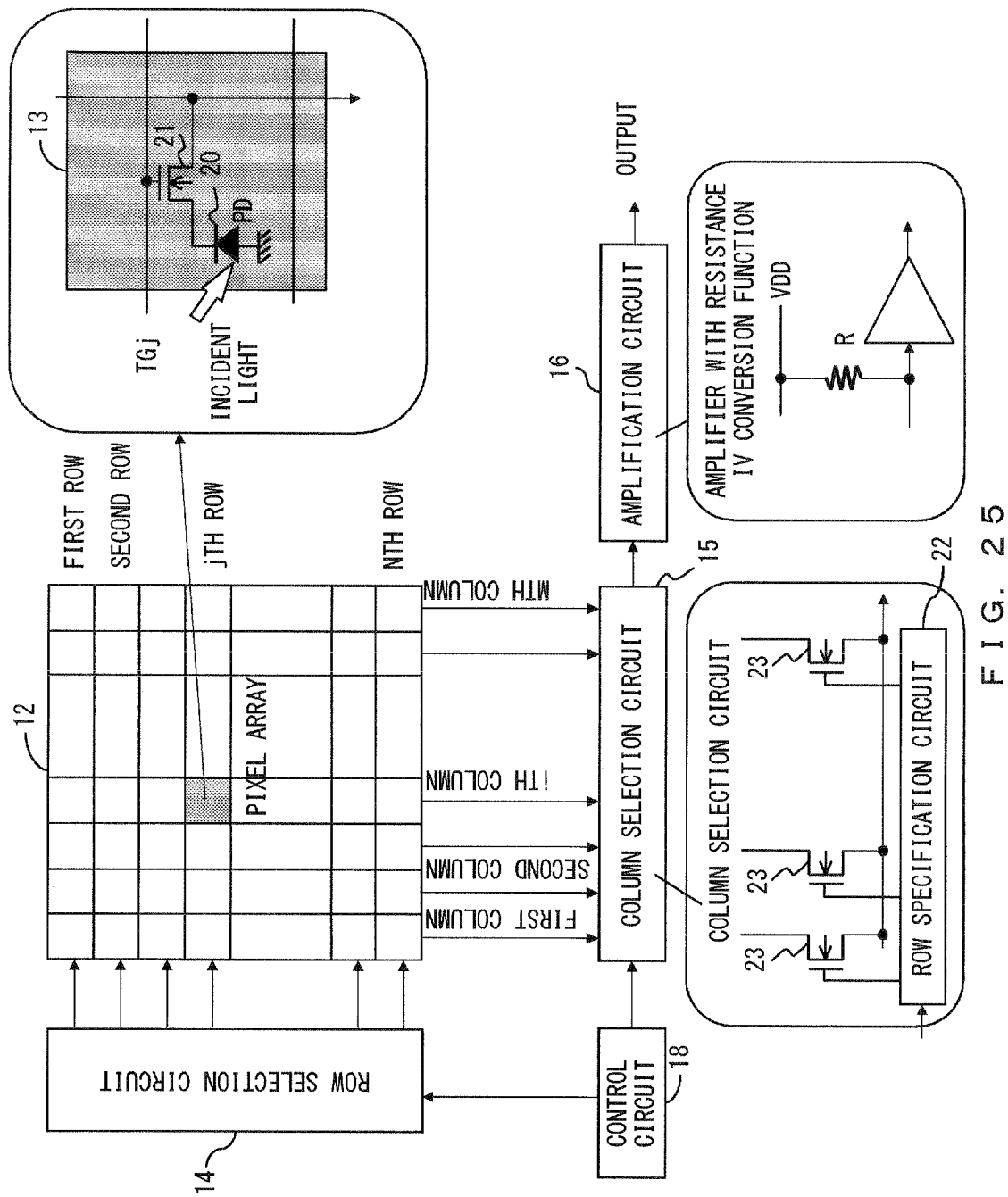
F I G. 25

LIGHT RECEIVING DEVICE AND LIGHT RECEIVING METHOD

CROSS-REFERENCE TO RELATED APPLICATION

This application is a continuation application of international PCT application No. PCT/JP2007/000248 filed on Mar. 16, 2007.

FIELD

The embodiments discussed herein are related to a light receiving system, and more particularly, to a light receiving device and a light receiving method for receiving a signal from an optical fiber or an optical disk with a photodiode and for converting the received optical signal into an electric signal, for example, in an optical communication system, optical wiring, an optical disk device, etc.

BACKGROUND

In an optical communication system, an optical interconnection, an optical disk device, etc., a light receiving device for converting an optical signal into an electric signal is used. FIG. 1 is a block diagram illustrating a configuration of a conventional example of a light receiving system. In FIG. 1, the system for gathering light output from an optical fiber 100 by a light-receiving element 102 such as a photodiode via a lens 101, for amplifying the output of the light-receiving element 102 by an amplification circuit 103, and for outputting the amplified output as an electric signal is used.

However, this system adopts the configuration for mounting the components by aligning an optical axis with the light-receiving element such as a photodiode in order to receive light from an optical fiber, an optical disk, etc. Therefore, the conventional system has a problem that the cost of parts including the lens, and the mounting cost are high. Especially, if a ribbon fiber where a plurality of optical fibers are arranged side by side is used, the cost of parts for aligning the optical axis of each optical fiber with a corresponding photodiode, and their mounting cost significantly increase.

Assume that the outer diameter (total diameter) of the optical fiber 100 is 100 μm, and the diameter of the core wire that actually transmits light is 10 μm in the light receiving system illustrated in FIG. 1. If the optical axis is misaligned, for example, by approximately several μms or less, conversion efficiency (OE conversion efficiency) from an optical signal into an electric signal is significantly decreased. Therefore, the alignment of the optical axis must be made with high precision in order to keep the OE conversion efficiency high, leading to an increase in the cost.

In the meantime, for example, increasing the diameter of the light-reception plane of the light-receiving element 102 such as a photodiode is considered to prevent the OE conversion efficiency from being decreased even if the optical axis is misaligned. However, a parasitic capacitance increases with an increase in the diameter of the light-receiving element, the response speed of the light-receiving element therefore drops, and a high-speed optical signal cannot be received. Accordingly, the demand for providing a light receiving device that reduces the cost required for aligning an optical axis and can receive a high-speed signal has been made.

Japanese Laid-open Patent Publication No. H1-138751, "Optical Sensor Array and Reading Device" as a conventional technique related to a connection between an optical fiber and a sensor discloses an optical sensor array and a reading device, which eliminate the need for a lens system and a self-focusing lens and improve the yield of a product by arranging an optical fiber unit within a light incident side translucent substrate of a photosensitive unit.

Additionally, Japanese Laid-open Patent Publication No. H6-350800, "Recognition Method for Substrate Having Optical Fiber Array and Semiconductor Device Using the Substrate" discloses a semiconductor device that can prevent quality degradation such as unevenness of a light quantity, etc. by recognizing an optical fiber array of an optical fiber array plate, and by mounting a semiconductor element at a predetermined position from the boundary face of the optical fiber array.

Furthermore, Published Japanese National Publication of International Patent Application No. H9-509494, "Method and Device for Detecting and Imaging Particles" discloses a method and a device for forming a digital image with high resolution in a format of a large spatial distribution of detected particles, for detecting the emission of particles from an emission source with an ultra-high sensitivity, and for quantifying the detected particles.

However, these conventional techniques cannot solve the problem that the cost for aligning an optical axis is high and the conversion efficiency from an optical signal into an electric signal significantly decreases when light output from, for example, an optical fiber is received with a photodiode if the optical axis is misaligned.

SUMMARY

An object of the present invention is to provide a light receiving device and a light receiving method, which reduce the cost for aligning an optical axis, and can receive a high-speed signal when receiving light output from, for example, an optical fiber with a photodiode, etc.

According to an aspect of the invention a light receiving device includes: an array of pixels each having a light-receiving element for receiving input signal light; an output selecting unit for selecting the outputs of pixels within the array; and a selected output adding unit for adding and outputting the selected outputs of the pixels.

According to an aspect of the invention a light receiving device can also include an amplifying unit for amplifying the output of the selected output adding unit.

According to an aspect of the invention a light receiving method includes: receiving input signal light with an array of pixels each having a light-receiving element; searching a pixel the output of which is not zero within the array, and selecting the outputs of pixels within the array according to a search result; and adding and outputting the selected outputs of the pixels.

According to an aspect of the invention a light receiving method can also include amplifying the output of the above described addition result of the outputs of the pixels.

As described above, according to an aspect of the invention, an array of pixels each having a light-receiving element, such as a two-dimensional pixel array receives light output from, for example, an optical fiber as input signal light, the outputs of pixels the output of which is not zero within the array are selected, and the selected outputs of the pixels are added, amplified and output.

As described above, according to the present invention, pixels the output value of which is not zero are selected within a pixel array, for example, by receiving input signal light, and the selected outputs of the pixels, for example, electric currents output from photodiodes are merged into one signal line and output by the selected output adding unit, whereby the alignment of an topical axis of an optical fiber with a light-receiving element can be facilitated. Moreover, by gathering the outputs of only light-receiving elements actually illuminated by a spot of the input signal light within the pixel array, a parasitic capacitance at the time of reception can be kept small. As a result, the light receiving device that can receive a high-speed signal can be implemented.

BRIEF DESCRIPTION OF DRAWINGS

FIG. 3 is an explanatory view of the entire configuration of a light receiving device according to an embodiment;

FIG. 8 is an explanatory view of a pixel search method in the first pixel selection method;

FIG. 14 is an explanatory view of a pixel search method in the fourth pixel selection method;

FIG. 15 is a block diagram illustrating a configuration of a second embodiment of the light receiving device;

FIG. 16A illustrates a configuration of a row selection determination circuit in the second embodiment;

FIG. 19 is a schematic diagram (No. 1) illustrating a positional relationship between spot lights from two optical fibers;

FIG. 25 is a block diagram illustrating a configuration of a fourth embodiment of the light receiving device;

DESCRIPTION OF EMBODIMENTS

Figure 1:
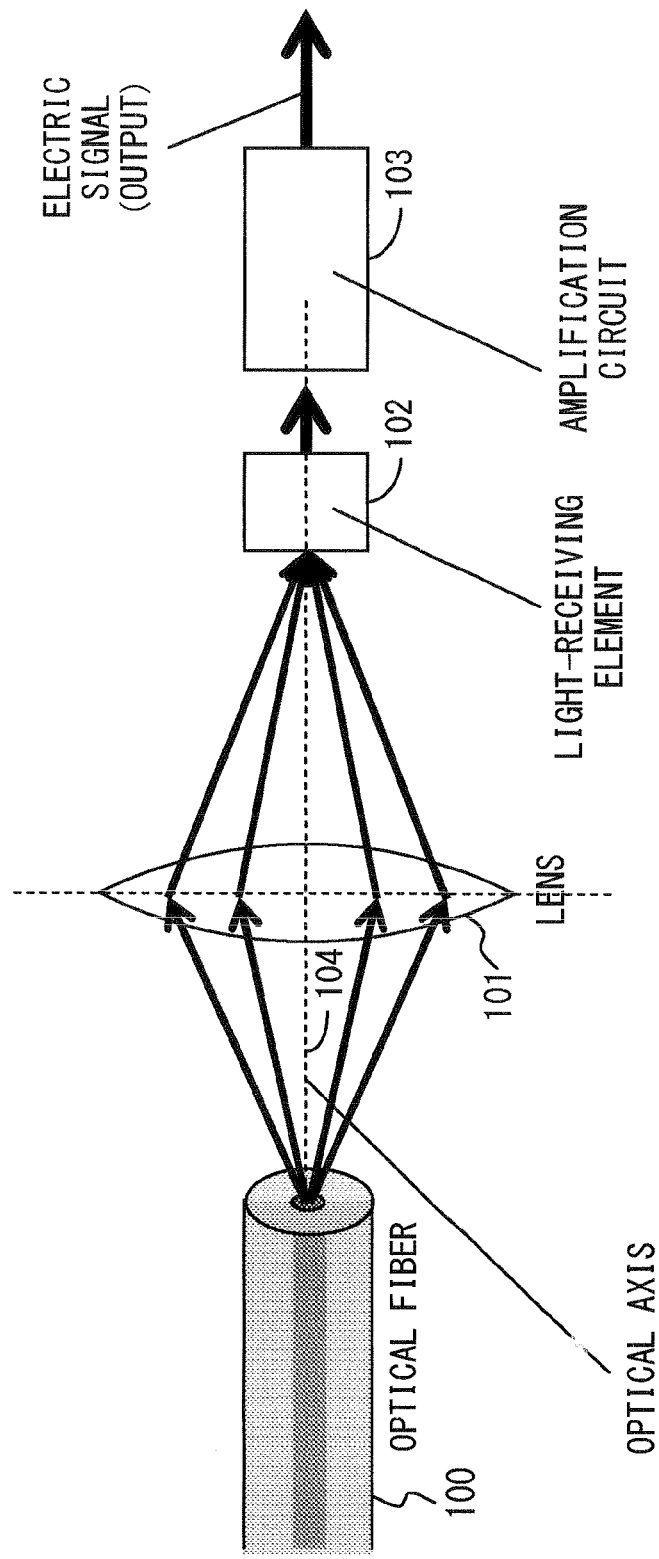
FIG. 1 is an explanatory view of a conventional example of a light receiving system.
Figure 2:
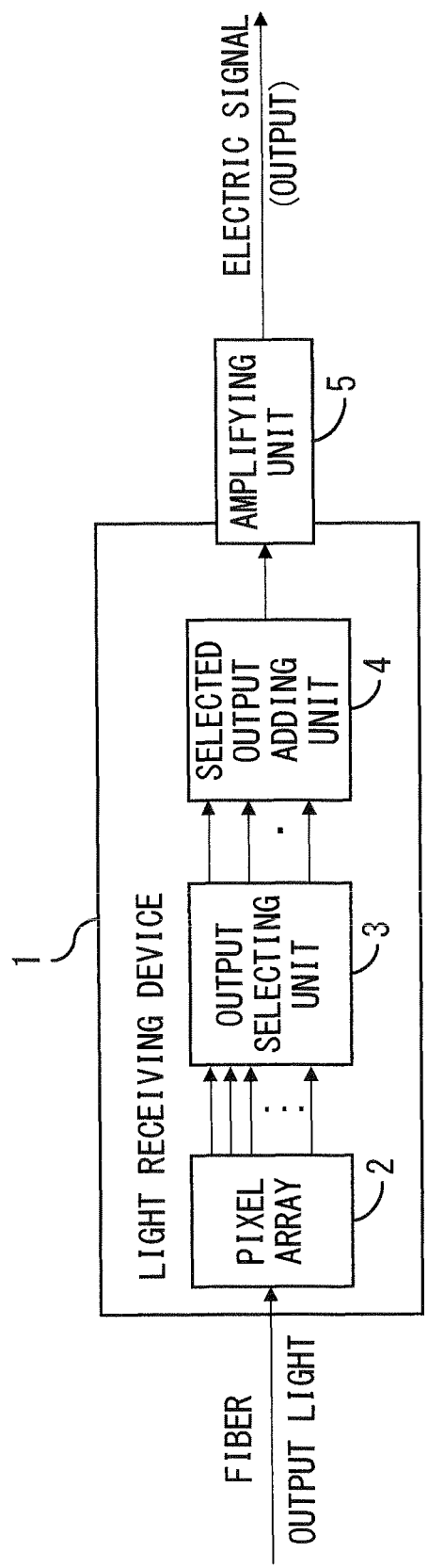
FIG. 2 is a block diagram illustrating a configuration of a light receiving device.

FIG. 2 is a block diagram illustrating a configuration of a light receiving device. In FIG. 2, the light receiving device 1 includes a pixel array 2, an output selecting unit 3, a selected output adding unit 4, and an amplifying unit 5.

In this embodiment, the pixel array 2 is, for example, a two-dimensional pixel array. Each pixel includes a light-receiving element for receiving light output from an optical fiber, and a switch such as a MOS transistor for externally outputting the output of the light-receiving element.

The output selecting unit 3 selects the outputs of pixels of the two-dimensional pixel array in units of rows or columns, and controls the selection of the outputs of pixels within the pixel array 2 by turning on the switch such as a MOS transistor within each pixel.

The selected output adding unit 4 adds electric currents by gathering, into one wire, the electric currents output from the light-receiving elements of pixels the switch of which is turned on within the pixel array. The amplifying unit 5 converts the addition result of the currents output from the light-receiving elements of pixels, which is output from the selected output adding unit 4, into voltage, and amplifies the voltage.

FIG. 3 is an explanatory view of the entire configuration of the light receiving device according to the embodiment. The light receiving device receives light output from an optical fiber 11. Namely, this device receives an optical signal with a spot 13 of an optical signal, which is formed on an array 12 of pixels each including a light-receiving element such as a photodiode, and a control element such as a MOS transistor serving as a switch.

The light receiving device selects outputs of pixels corresponding to the spot 13 of the optical signal among the pixels that configure the two-dimensional pixel array 12 with a row selection circuit 14 and a column selection circuit 15. After adding the currents of the selected outputs, the light receiving device outputs the added output current as an electric signal 17 by the amplification circuit 16.

Figure 6:
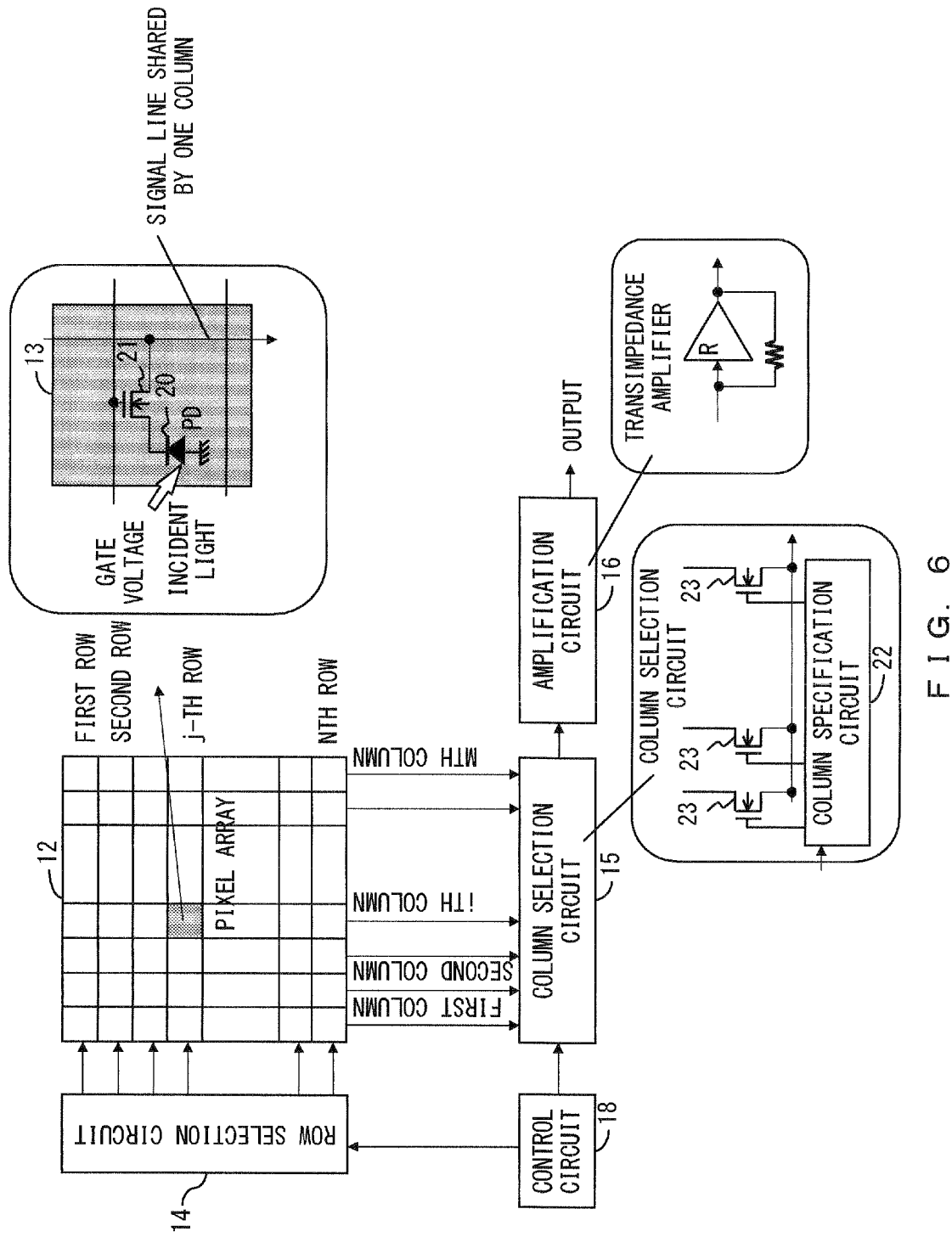
FIG. 6 is a block diagram illustrating a configuration of a first embodiment of the light receiving device.

As will be described later in FIG. 6, the row selection circuit 14 turns on, in units of rows, a control element within each pixel, namely, a switch such as an n(-channel)MOS transistor for outputting the output current of the photodiode as the light-receiving element to a connection line of each column, whereas the column selection circuit 15 turns on switches such as nMOS transistors for connecting a signal line, to which MOS transistors are connected for each column, to a signal line to the amplification circuit 16 in units of columns. The amplification circuit 16 converts the electric current, which is gathered from the signal line that is turned on for each column, into a voltage, and amplifies the voltage. The amplification circuit 16 is configured, for example, with a transimpedance amplifier.

Figure 4:
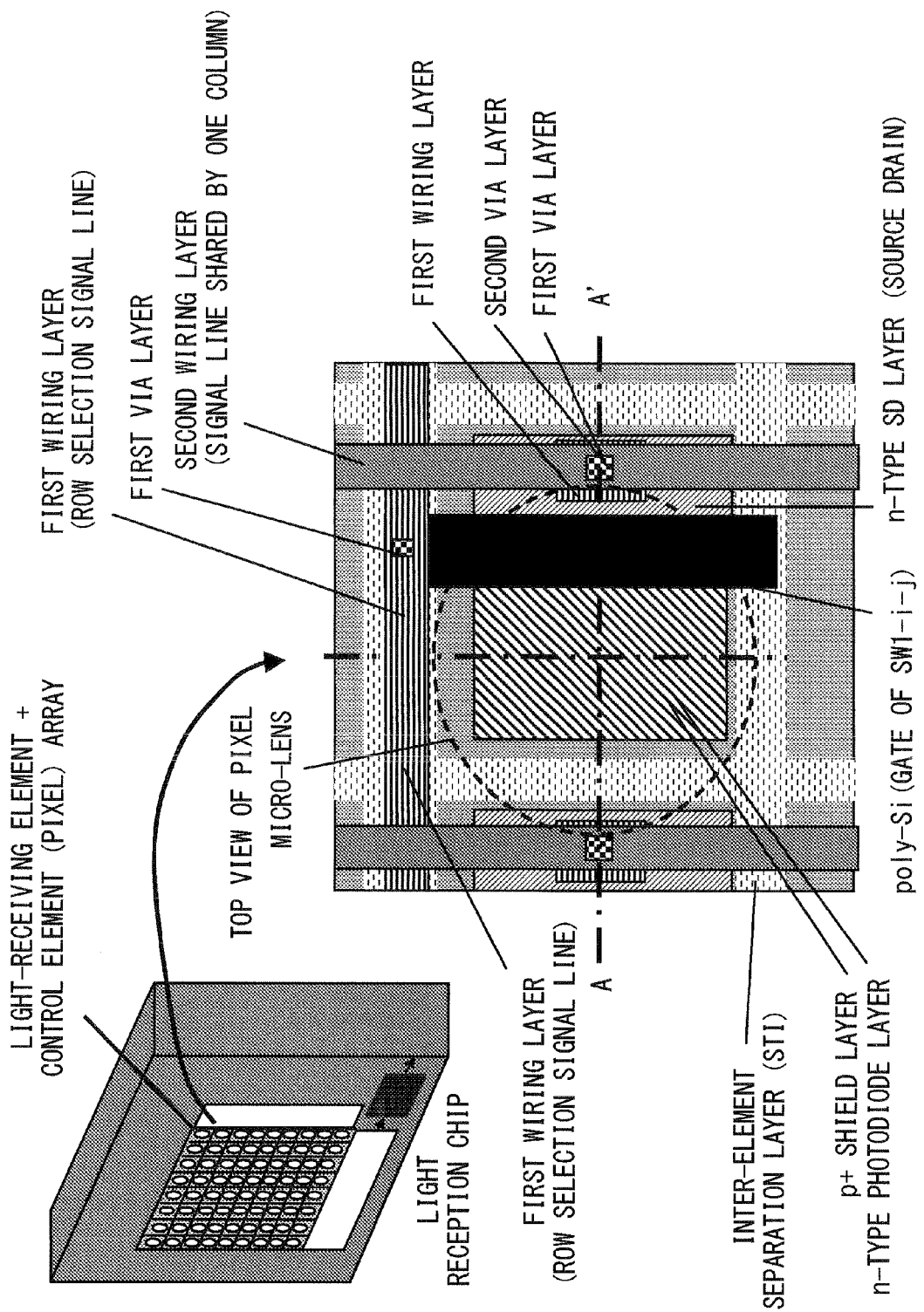
FIG. 4 is a cross-sectional view (No. 1) of a pixel of the light receiving device illustrated in FIG. 3.
Figure 5:
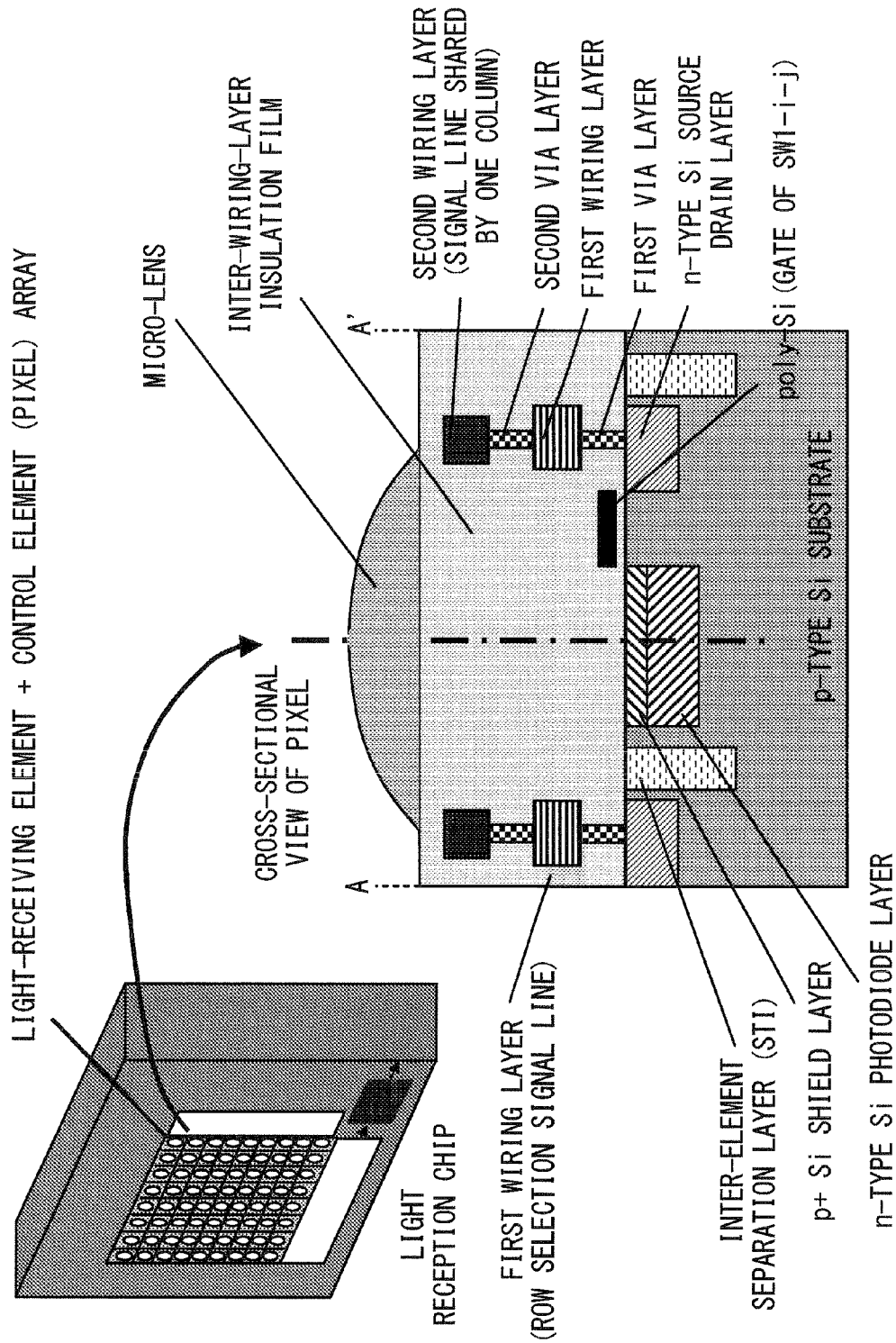
FIG. 5 is a cross-sectional view (No. 2) of the pixel of the light receiving device illustrated in FIG. 3.

FIGS. 4 and 5 are explanatory views of the details of a configuration example of a light reception chip for each pixel. FIG. 4 is a top view when a pixel in the pixel array of FIG. 3 is viewed from the left side. In FIG. 4, an on-chip micro-lens that Is represented with a dotted circle and intended to improve a light gathering ratio exists on the surface of the pixel. A signal line corresponding to the row selection circuit 14 of FIG. 3 is represented as a first wiring layer, and a signal line shared by one column corresponding to the column selection circuit 15 is represented as a second wiring layer. Below the second wiring layer, areas of a photodiode, and a gate, a source and a drain, which configure an n(-channel) MOS transistor, are represented. The on-chip micro-lens can be manufactured with the manufacturing technology established in the field of image pickup elements such as a CCD, an image sensor, etc. The wiring layers, etc. can be manufactured with the manufacturing technology in the field of LSIs.

FIG. 5 is a cross-sectional view when the configuration of FIG. 4 is taken along a line AA' in the top view. In FIG. 5, the micro-lens exists as the topmost layer, the signal line shared by one column exists as the second wiring layer below the topmost layer. A second VIA layer, the first wiring layer, namely, a column selection signal line, and a first VIA layer are sequentially represented below the second wiring layer. Below the first VIA layer, the areas of the photodiode, and the gate, the source and the drain of the MOS transistor are represented.

The term "pixel" means a minimum unit cell including a photodiode for converting the optical information of spatial part of an image into an electric signal, and a transistor in the field of image pickup elements. The present invention is not always intended for image pickup purposes. However, the term "pixel" is used since it is the same as a pixel of an image pickup element in a point that the "pixel" is a cell that handles a spot of light from an optical fiber, etc. as a two-dimensional plane, and includes a photodiode for converting the optical information of part of the spot into an electric signal, and a transistor. FIG. 6 is an explanatory view of a first embodiment of the light receiving device. In FIG. 6, the light receiving device includes the row selection circuit 14, the column selection circuit 15 and the amplification circuit 16 in order to select the outputs of pixels that configure the pixel array 12 and are arranged two-dimensionally, and to amplify and output a result of adding the output currents of the selected pixels, and further includes a control circuit 18 for controlling a row selection made by the row selection circuit 14, and a column selection made by the column selection circuit 15.

Each of the pixels configuring the pixel array 12 is composed of a photodiode (PD) 20 for receiving the output of an optical fiber, and an n-channel MOS transistor 21 for outputting the output current of the photodiode to a line shared by each column. The row selection is made by driving the gate voltage of the transistor 21 to "H" or "L" according to the output of the row selection circuit 14.

The column selection circuit 15 includes n-channel MOS transistors 23 as switches for respectively connecting a signal line shared by each column to a wire to the amplification circuit 16, and also includes a column specification circuit 22. Pixels in each column within the pixel array are selected by controlling ON/OFF of each transistor according to a voltage provided from the column specification circuit 22 to the gate of each transistor 23.

Furthermore, the amplification circuit 16 converts an input current into a voltage, amplifies and outputs the voltage according to the input of an addition result of currents of each column resulting from the selection made by the row selection circuit 15. Here, the amplification circuit 16 is a transimpedance amplifier that is generally used in a light receiving device.

An output selecting unit recited in claim 1 of the present invention corresponds to the row selection circuit 14, and the column specification circuit 22 within the column selection circuit 15, and the selected output adding unit corresponds to one signal line providing an input to each transistor 23 within the column selection circuit 15, and the amplification circuit 16.

Figure 7:
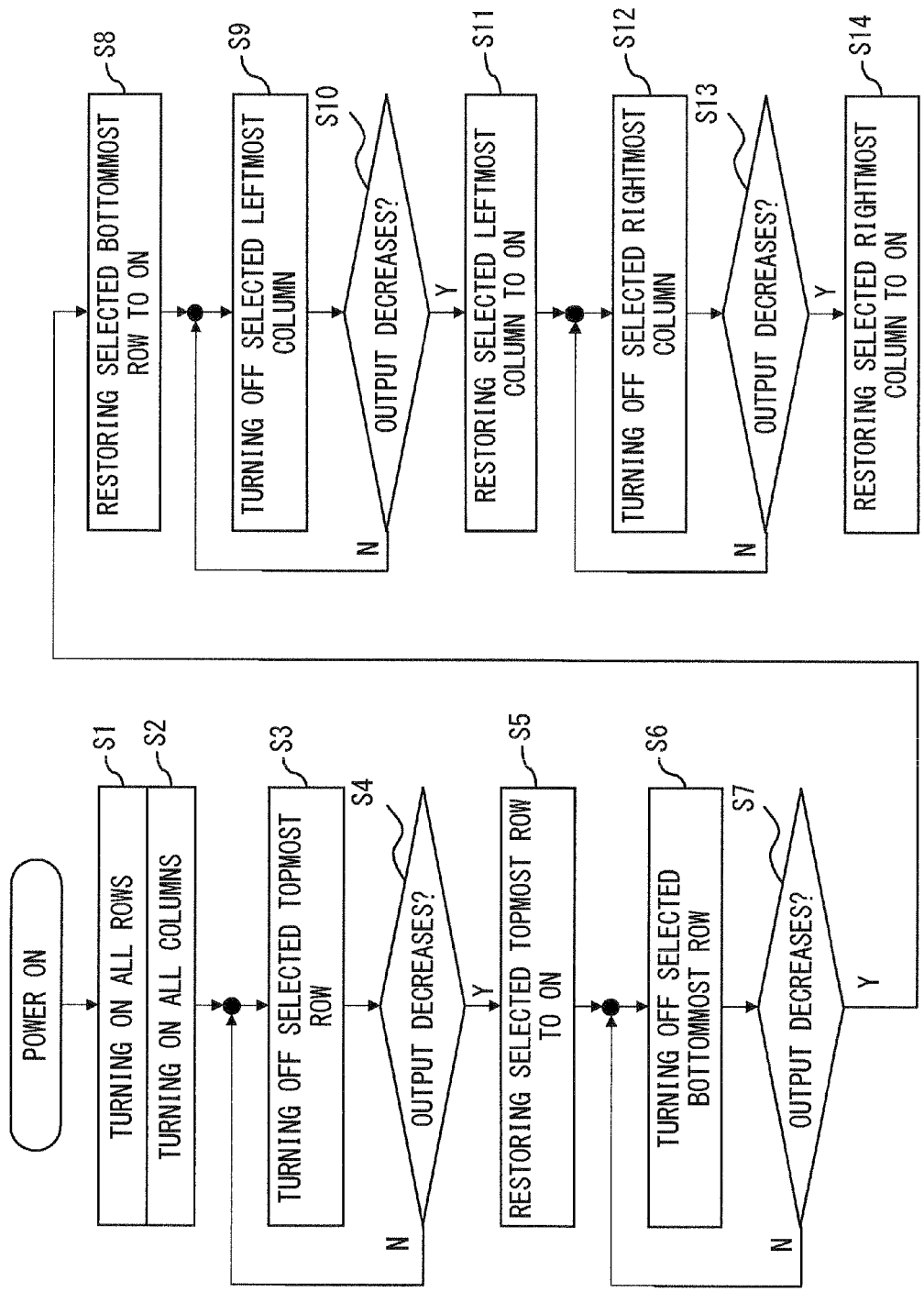
FIG. 7 is a flowchart illustrating a process of a first pixel selection method in the first embodiment.

FIGS. 7 and 8 are explanatory views of a first pixel selection method in the first embodiment. FIG. 7 is a flowchart illustrating the process of the first pixel selection method, whereas FIG. 8 is the explanatory view of a selection range search process.

In FIG. 7, once power is turned on to start the process, transistors within the pixels in all the rows and the columns are turned on in steps S1 and S2. In step S3, the transistors within the pixels in the topmost row, namely, the first row of the pixel array are turned off, and whether or not the output of the amplification circuit 16 decreases is determined.

In FIG. 8, assume that the leftmost row and the rightmost row respectively indicate the first row and an Nth row. In this case, the output does not decrease if only the pixels in the first row are turned off. In step S3, the pixels in the selected topmost row, namely, the second row are turned off. Then, the determination of step S4 is made. If the selected row corresponding to the topmost row in the range where the spot 13 of the optical signal is illuminated on the pixel array as illustrated in FIG. 3 is turned off, the output of the amplification circuit 16 decreases. Therefore, the pixels in the selected topmost row, namely, the row that decreases the output are restored to ON in step S5, and the row selection starting at the top of the two-dimensional pixel array is terminated.

Next, the rightmost row, namely, the bottommost row in FIG. 8 is selected, and the pixels in the selected row are turned off in step S6. Then, whether or not the output decreases is determined in step S7. If the spot of the optical signal is not illuminated on the pixels in the selected row, the output does not decrease as a matter of course. Then, in step S6, the second bottommost row is selected, and the pixels in the selected row are turned off. Then, whether or not the output decreases is determined in step S7.

If the bottommost row illuminated by the spot 13 of the optical signal in FIG. 3 is selected and the pixels in the selected row are turned off, the output decreases as a matter of course. Then, the pixels in the selected bottommost row are restored to ON in step S8, and the row selection starting at the bottom side of the two-dimensional pixel array is terminated.

Similar processes are executed for the leftmost column, namely, the first column of the two-dimensional pixel array in steps S9 to S11, and the column selection starts at the left side of the two-dimensional pixel array. Similar processes are executed for the rightmost column, namely, an Mth column of the two-dimensional pixel array in steps S12 to S14. Then, the column selection starting at the right side is terminated. As a result, the pixels generally in a rectangular area including all the pixels illuminated by the spot 13 of the optical signal are selected, and the output corresponding to the pixels is obtained.

The above described pixel selections are generally made when the light receiving device starts to be used. However, such selections can be, for example, repeatedly made in consideration of a protocol in an actual communication system. Additionally, in a case where the optical axis of a fiber is misaligned with high possibility due to influences of a temperature or jolts, an efficient reception of an optical signal can be continuously made by repeatedly making such selections at suitable time intervals.

Figure 9:
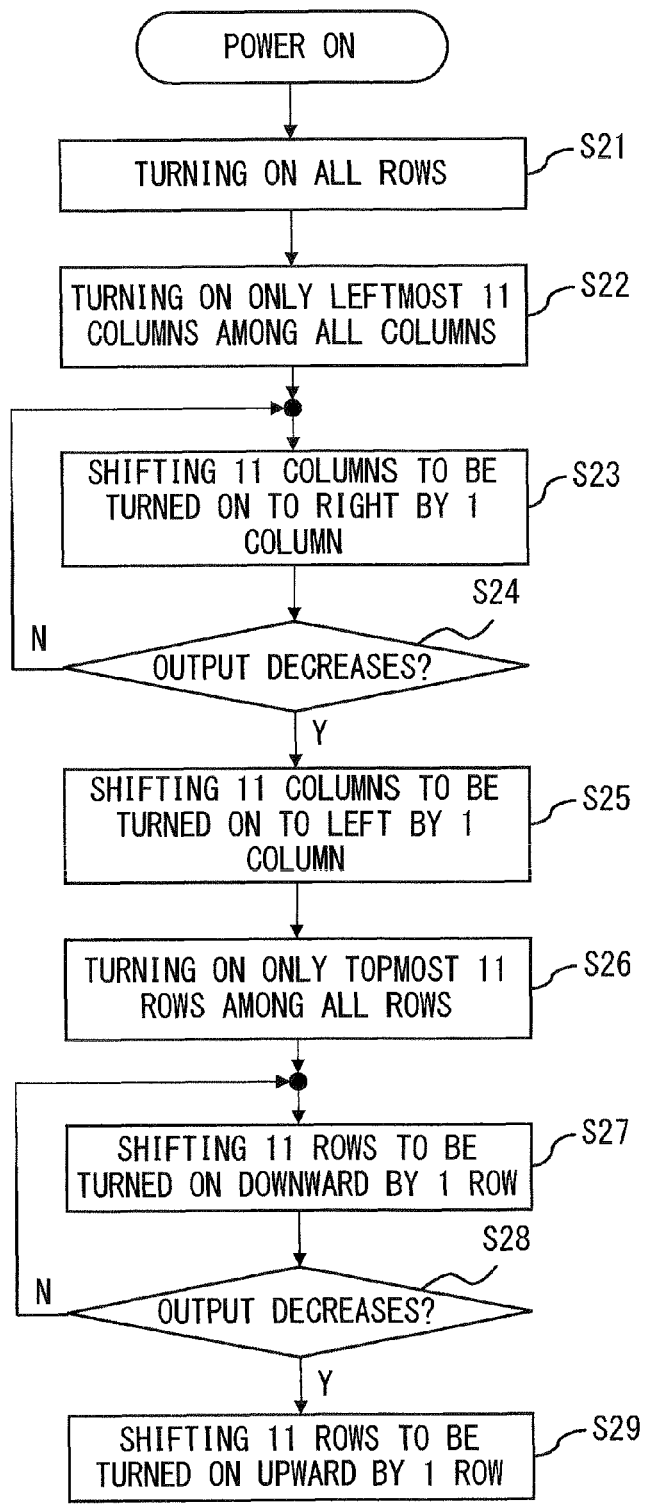
FIG. 9 is a flowchart illustrating a process of a second pixel selection method in the first embodiment.
Figure 10:
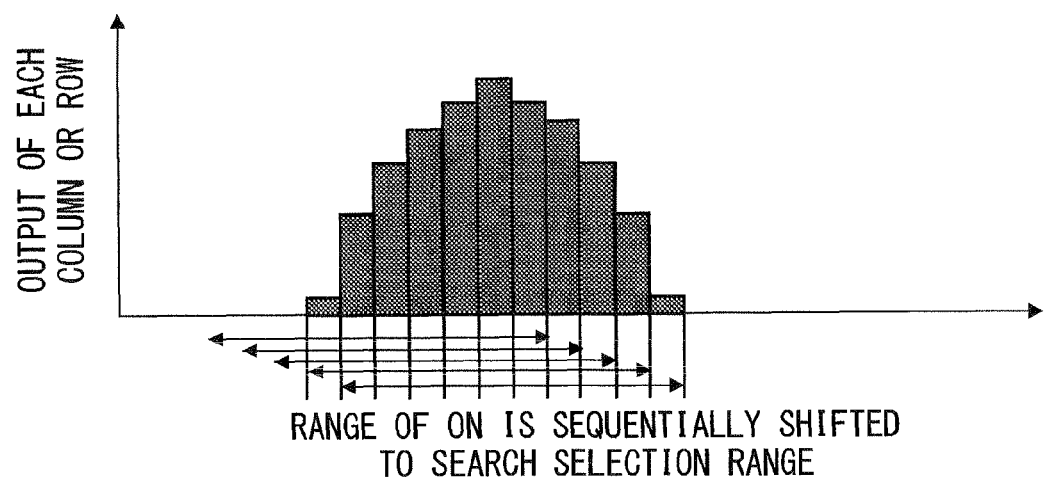
FIG. 10 is an explanatory view of a pixel search method in the second pixel selection method.

FIGS. 9 and 10 are explanatory views of a second pixel selection method in the first embodiment. Once power is turned on in the process flowchart of FIG. 9, only pixels in the leftmost 11 columns among all the columns are turned on after the pixels in all the rows are turned on in step S21. Then, 11 columns in which the pixels are to be turned on are shifted to the right by one column in step S23. Whether or not the output decreases is determined in step S24.

In FIG. 10, the output decreases after the rightmost column among the 11 columns reaches the column corresponding to the maximum value when the columns are being sequentially shifted by one column while turning on pixels in units of 11 columns from the leftmost one. If the columns are further shifted to the right, the output further decreases. Accordingly, the positions of 11 columns before the output decreases are proved to be the range of pixel columns to be selected to maximize the output. Therefore, the range of 11 columns that maximize the output of the amplification circuit 16 is selected by shifting 11 columns in which the pixels are to be turned on to the left by one column in step S25 to restore the columns.

Here, the column selection is terminated. Then, in and after steps S26, the row selection is made. In step S26, the pixels in the topmost 11 rows among all the rows are turned on. Since the pixels in all the rows have been turned on in step S21, the pixels only in the topmost eleven rows are turned on by turning off the pixels in all the rows except for the topmost 11 rows. Then, in steps S27 to S29, 11 rows in which the pixels are to be turned on are selected similar to the column selection.

Figure 11:
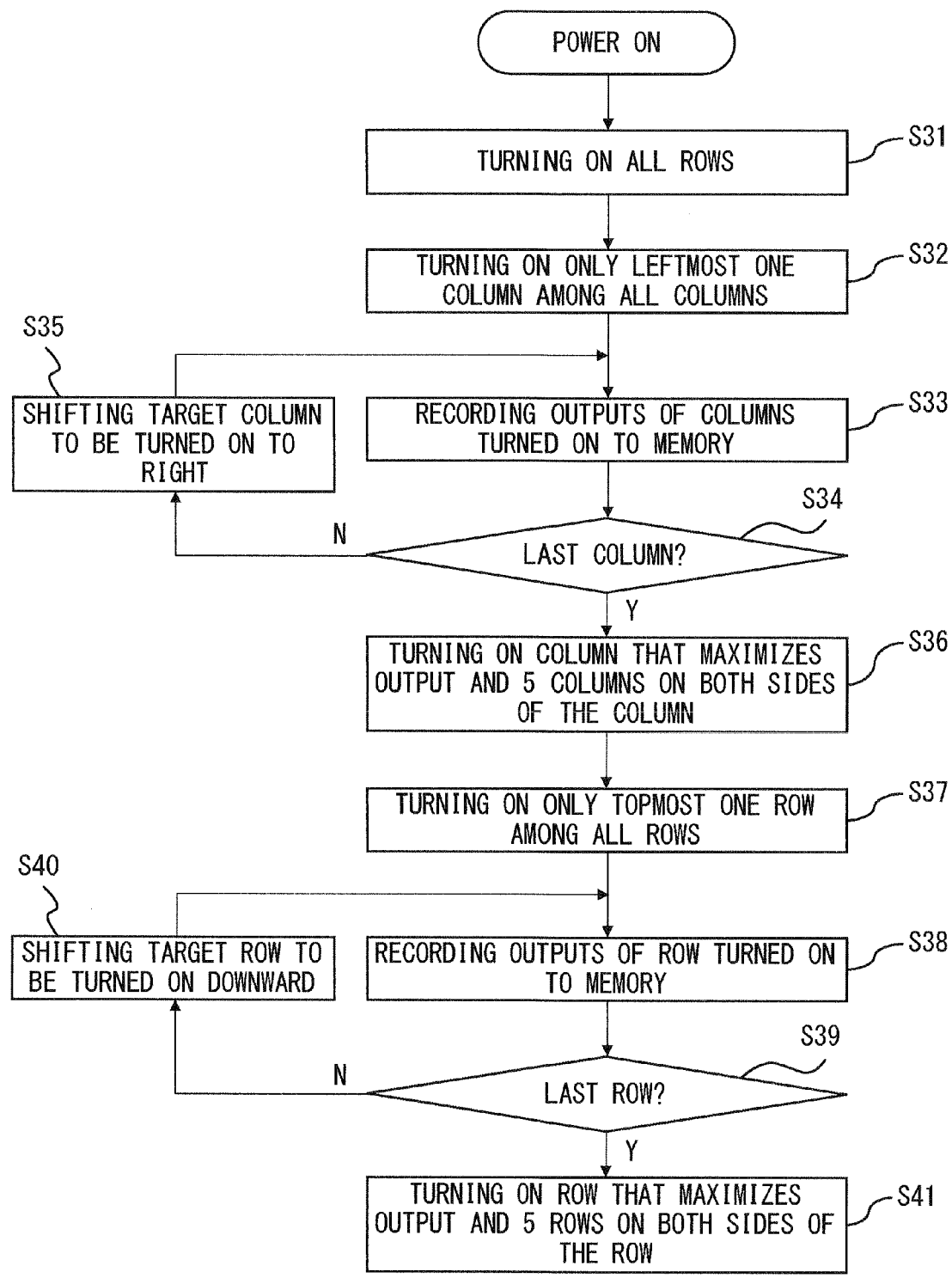
FIG. 11 is a flowchart illustrating a process of a third pixel selection method in the first embodiment.
Figure 12:
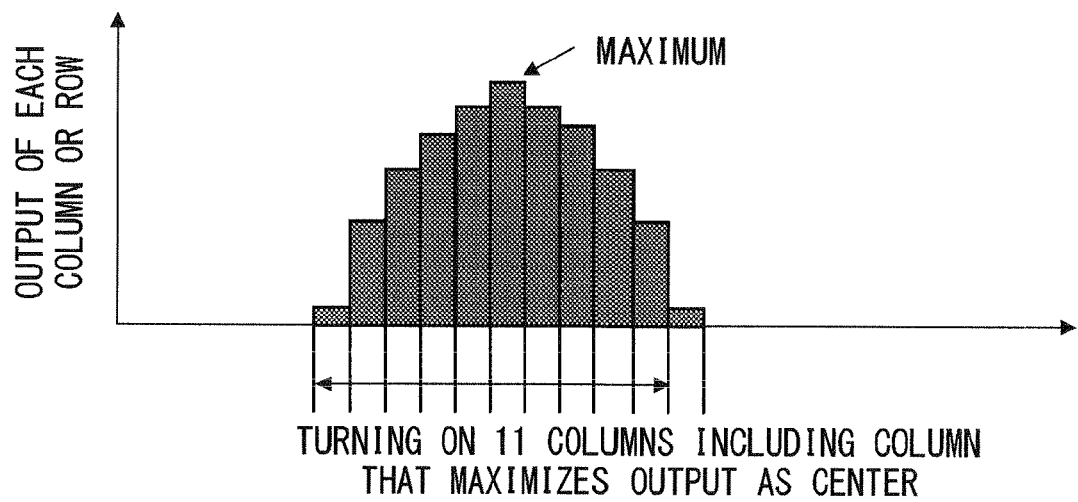
FIG. 12 is an explanatory view of a pixel search method in the third pixel selection method.

FIGS. 11 and 12 are explanatory views of a third pixel selection method in the first embodiment. Once power is turned on in the process flowchart of FIG. 11, the pixels in all the rows are turned on in step S31. Then, in step S32, only the pixels in the leftmost column among all the columns are turned on. In step S33, the output of the leftmost column is recorded to the memory. Then, in step S34, whether or not the pixels in the last column are turned on is determined.

Since the pixels in the last column have not been turned on yet here, a target column in which pixels are to be turned on is shifted to the right in step S35. Then, the processes in and after step S33 are repeated. As a result, all the values of the output when the pixels in each of the first to the Mth columns are sequentially turned on are recorded to the memory.

If the pixels in the last column are determined to be turned on in step S34, the column that maximizes the output is obtained, and pixels in the total of 11 columns including the obtained column and five columns on both sides of the obtained column are turned on in step S36.

Then, similar processes are executed for the row selection in steps S37 to S41. Initially, the pixels only in the topmost row among all the rows are turned on in step S37. Since the pixels in all the rows have been turned on in step S31, the pixels only in the topmost row are actually turned on by turning off the pixels in all the rows except for the topmost row.

Then, in steps S38 to S40, the values of the output when the rows are sequentially turned on while a target row in which pixels are to be turned on is being shifted downward by one row are recorded to the memory. In step S41, pixels in the total of 11 rows including the row that maximizes the output and five rows on both sides of the above row are turned on.

FIG. 12 illustrates the values of the output obtained when the pixels in 11 columns including the column that maximizes the output and five columns on both sides of the above column are sequentially turned on. In this embodiment, assume that the diameter of the spot of the optical signal in FIG. 3 is approximately 100 µm, and one side of each pixel is approximately 10 µm. Also assume that the diameter of the spot of the optical signal is approximately the total of the lengths of 10 pixels. In this case, it is considered that the light of the spot of the optical signal can be almost completely captured by turning on the pixels, for example, in the total of 11 columns including the column that maximizes the output and five columns on both sides of the above column.

Figure 13:
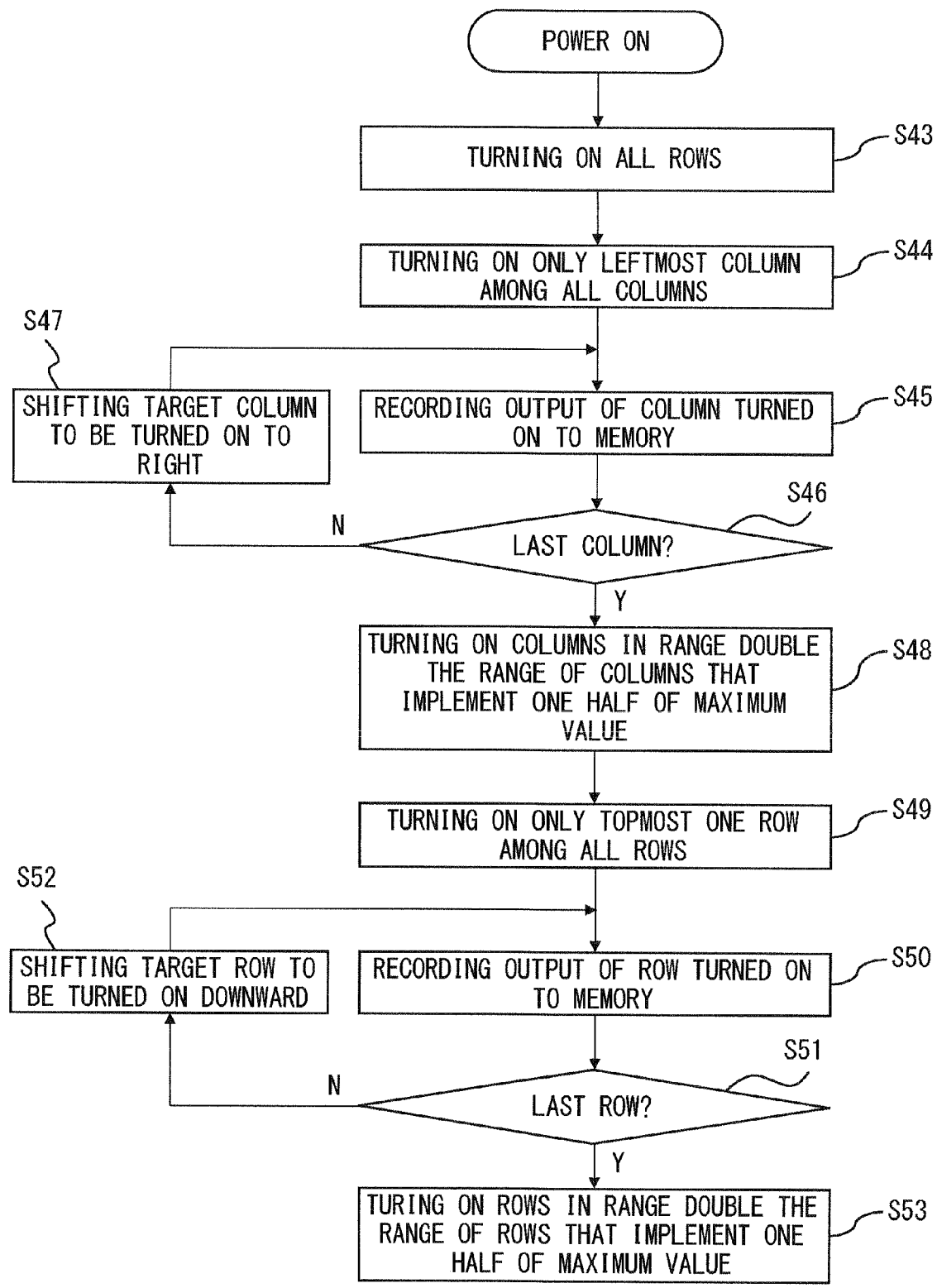
FIG. 13 is a flowchart illustrating a process of a fourth pixel selection method in the first embodiment.

FIGS. 13 and 14 are explanatory views of a fourth pixel selection method in the first embodiment. With the third selection method described with reference to FIGS. 11 and 12, for example, the output of each of all the columns is obtained, and pixels in a column that maximizes the output and five columns on both sides of the above column are turned on. With the fourth selection method, however, pixels are selected by turning on pixels in columns in a range double the range that includes a column maximizing the output, and implements one half of the maximum output value.

In steps S43 to S47 of FIG. 13, similar processes in steps S31 to S35 of FIG. 11 are executed. Then, pixels in columns in a range double the range of columns that implement one half or more of the maximum output value are turned on in step S48. Then, the row selection process is similarly executed in steps S49 to S53. In step S53, pixels in rows in a range double the range of rows that implement one half of the maximum output value are turned on.

FIG. 14 illustrates the state where the pixels in the columns in the range double the range of columns that implement, for example, one half of the output of the column that maximizes the output, namely, the maximum value are turned on. Assuming that the spot of the optical signal is circular in FIG. 3, for example, the column that maximizes the output is the column that passes through the center of the circle, and the output of the column is considered to rapidly decrease as it moves away from the center. Therefore, it is considered that the light of the circular spot can be almost completely covered by turning on pixels in columns in a range double the range that implements one half of the maximum value.

FIG. 15 is a block diagram illustrating a configuration of a second embodiment of the light receiving device. Two column selection circuits and two amplification circuits are provided in the second embodiment. The second embodiment of FIG. 15 has a two-channel type configuration in order to receive the light of a fiber such as a ribbon fiber in which a plurality of fibers are arranged in a straight line. Namely, to receive the optical signal output from the ribbon fiber, in which two fibers are arranged side by side, as two channels, namely, outputs 1 and 2, the lights output from the two optical fibers are separated by respectively changing the selection ranges of pixel columns for the outputs 1 and 2, and extracted as the outputs 1 and 2.

Figure 16B:
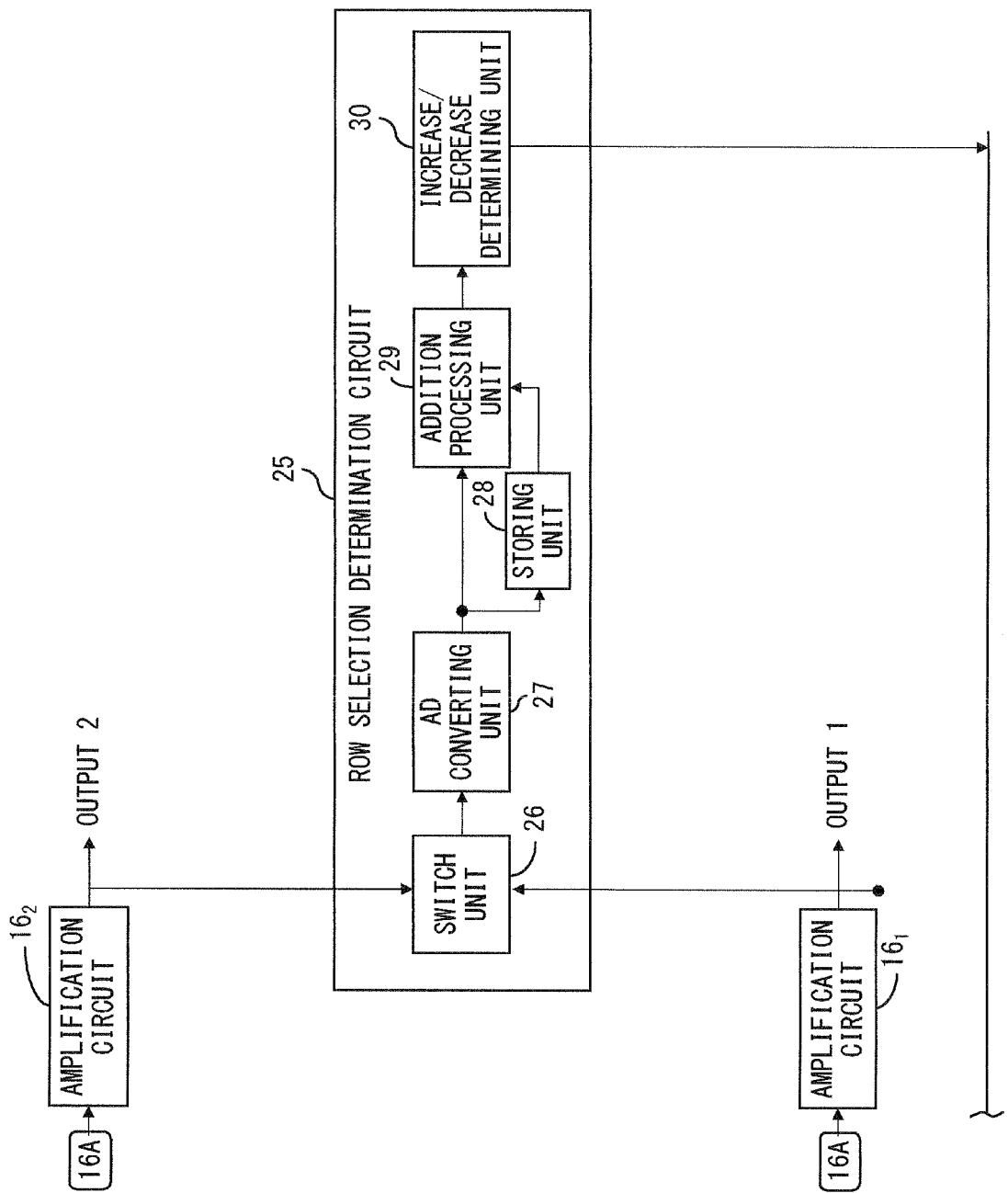
FIG. 16B illustrates a configuration of a row selection determination circuit in the second embodiment.

FIGS. 16A and 16B illustrate an example where a row selection determination circuit 25 for making a row selection in the second embodiment is added. In the second embodiment, a column selection can be made with the basic configuration, namely, the configuration of FIG. 15. To properly make the row selection, however, the row selection determination circuit is required.

Figure 17A:
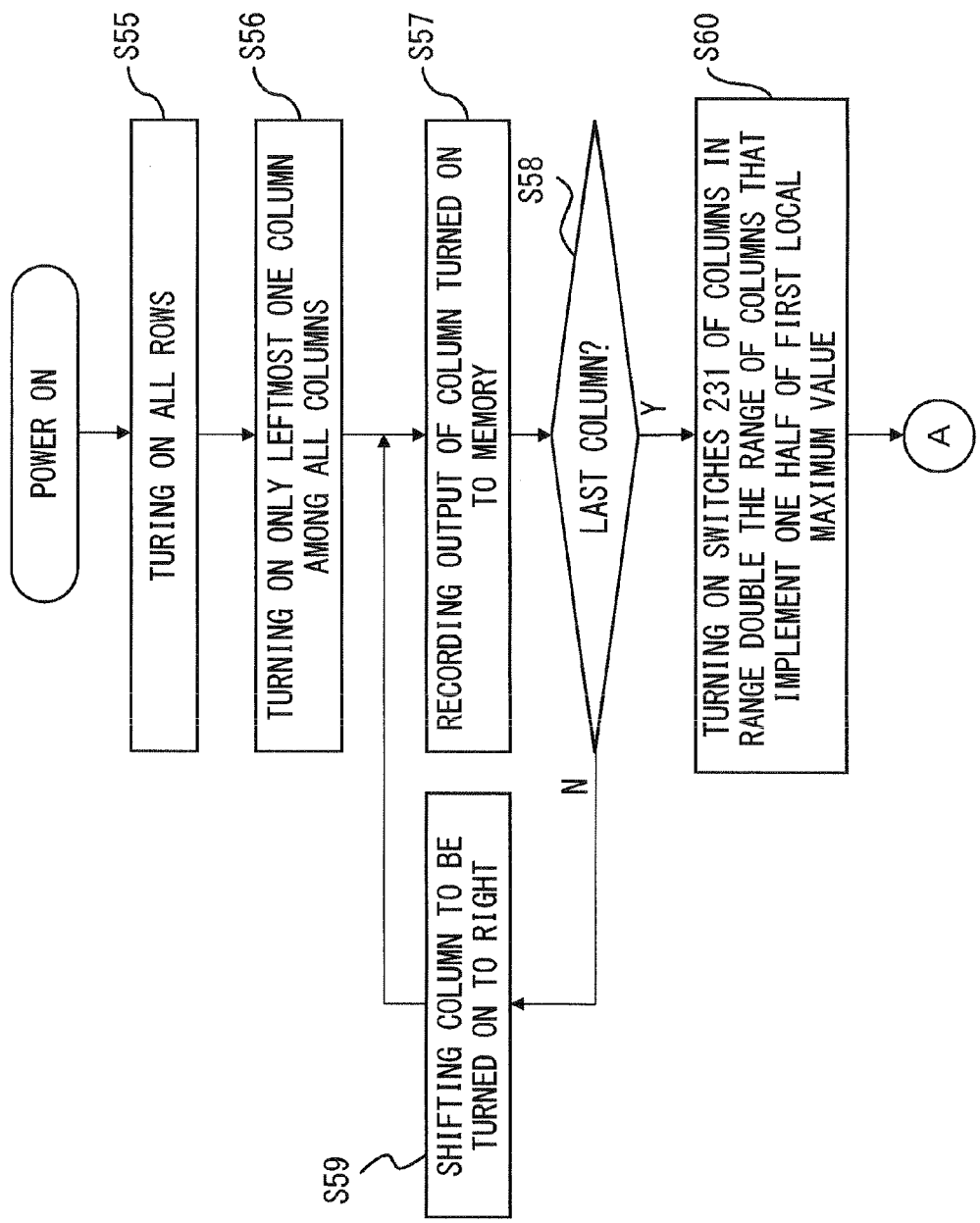
FIG. 17A is a flowchart illustrating a process of a pixel selection method in the second embodiment.
Figure 17B:
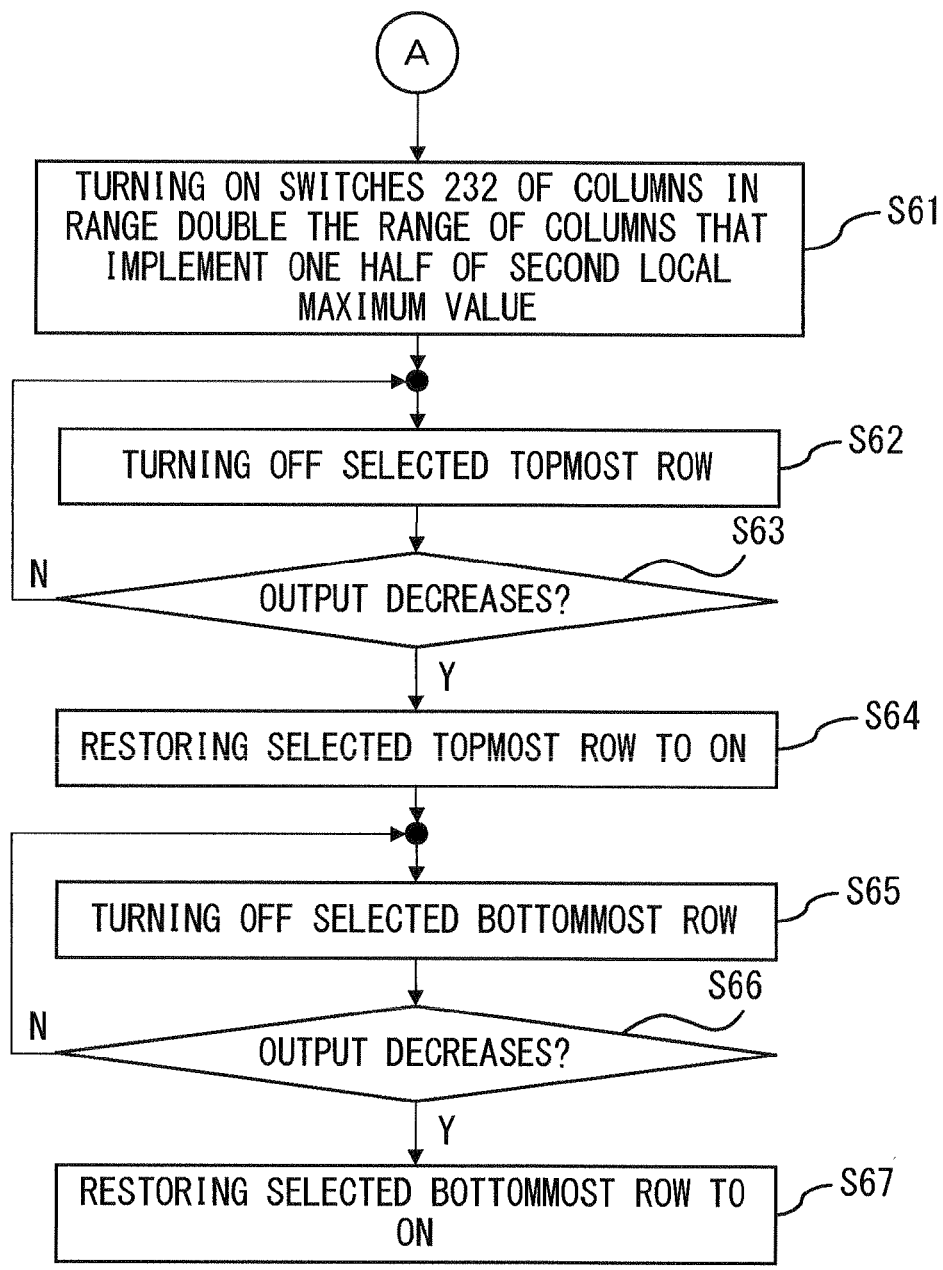
FIG. 17B is a flowchart illustrating a process of a pixel selection method in the second embodiment.
Figure 18:
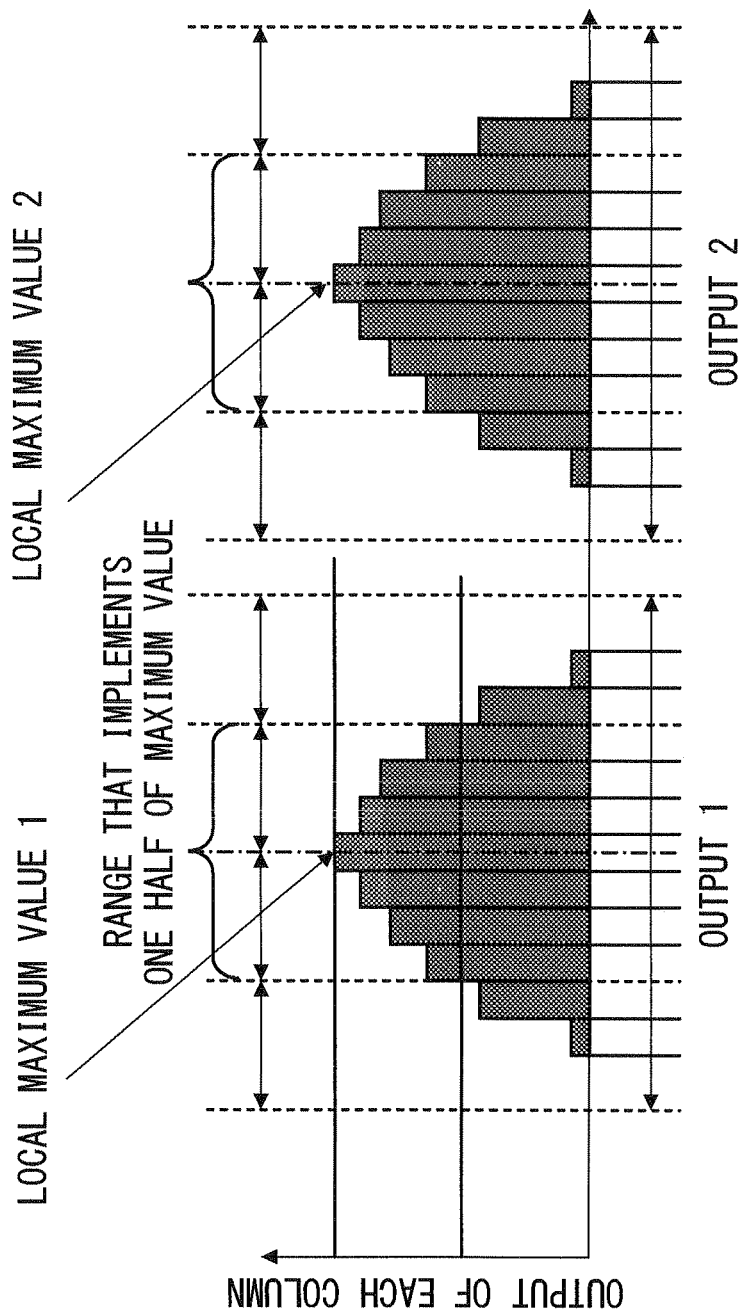
FIG. 18 is an explanatory view of the pixel search method in the second embodiment.

A pixel selection method in the second embodiment of FIGS. 15, 16A and 16B is described with reference to FIGS. 17A, 17B and 18. In the flowchart of FIGS. 17A and 17B, the column selection is initially made in steps S55 to S61. This column selection is made by respectively observing the outputs 1 and 2 as the outputs of the two amplification circuits $16_1$ and $16_2$ in the basic configuration of FIG. 15, and by recording, for example, an addition result of the outputs 1 and 2 to the memory.

Initially, pixels in all the rows are turned on in step S55. In step S56, the leftmost column among all the pixel columns is turned on. Namely, only the leftmost MOS transistors $23_1$ and $23_2$ within two column selection circuits $15_1$ and $15_2$ are turned on for the pixels in the first column in FIG. 15. Then, for example, the addition result of the values of the outputs 1 and 2 is recorded to the memory in step S57. In step S58, whether or not the pixels in the last column are turned on is determined. Here, the last column has not been turned on yet, a target column in which pixels are to be turned on is shifted to the right in step S59, and the outputs of the pixels in the second column are added and recorded to the memory in step S57.

Such a process continues to be executed until the pixels in the last column, namely, the Mth column in FIG. 15 are turned on. If the pixels in the last column are determined to be turned on in step S58, switches $23_1$ in columns in a range double the range that implements one half of the first local maximum value corresponding to the output 1 are turned on, and switches $23_2$ in columns in a range double the range that implements one half of the second local maximum value corresponding to the output 2 are turned on. By limiting the switches to be turned on to only either of the output sides, the parasitic capacitance in the pixel selection circuit can be reduced. As a matter of course, not the addition result of the outputs 1 and 2 but only either of the outputs 1 and 2 may be recorded to the memory in step S57.

In steps S62 to S67 of FIG. 17B, the row selection is made. Here, the row selection method is similar to, for example, the processes in steps S3 to S8 of FIG. 7 in the first embodiment. However, the two outputs, namely, the outputs 1 and 2 are obtained in the second embodiment. Therefore, the row selection is made by determining whether or not the output of the sum of the outputs 1 and 2 decreases each time a row is selected and turned off with the use of the row selection determination circuit 25 as illustrated in FIG. 16.

In FIGS. 17A and 17B, the pixels in all the rows are turned on in step S55. In step S62, the outputs 1 and 2 are switched by a switch unit 26 and provided to an AD converting unit 27 in the state where pixels in the selected topmost row are turned off in step S62. Assuming that the output 1 is provided earlier, the result of the AD conversion of the output 1 is stored in a storing unit 28. Thereafter, the result of the AD conversion of the output 2 output from the switch unit 26 is added to the stored result by an addition processing unit 29, and the addition result is provided to an increase/decrease determining unit 30. The increase/decrease determining unit 30 stores, in a memory not illustrated, the addition result of the AD conversion results of the outputs 1 and 2 in the state before the pixels in the selected topmost row are turned off in step S62, namely, the state where the pixels in all the rows are turned on, makes a comparison between the stored result and the addition result obtained when the selected topmost row is turned off, and determines whether or not the output decreases in step S63.

By repeating similar processes while sequentially shifting a selected row downward by one row, pixels in a selected row are restored to ON in step S64 when a row that decreases the output is detected. This search method is the same as that described with reference to FIG. 8. Similar processes start to be executed at the bottommost row in steps S65 to S67, whereby the bottommost row among the rows illuminated by the spot of the optical signal is detected.

The above described second embodiment is described by assuming that the waveforms of the outputs of pixels in respective columns are clearly separated into, for example, two based on the premise that the direction where optical fibers are arranged in a straight line as in a ribbon fiber is almost parallel to the row direction of the two-dimensional pixel array. For example, a distance between fibers in the ribbon fiber is almost the same as the size of the above described spot of the light output from the fiber on the pixel array, for example, 100 μm, and the spots of the optical signal can be considered not to overlap in the column direction. In contrast, in the row direction, the spots of the optical signal can overlap due to a flexion, etc. of a fiber, which can possibly disable two ranges to be separated.

Figure 20:
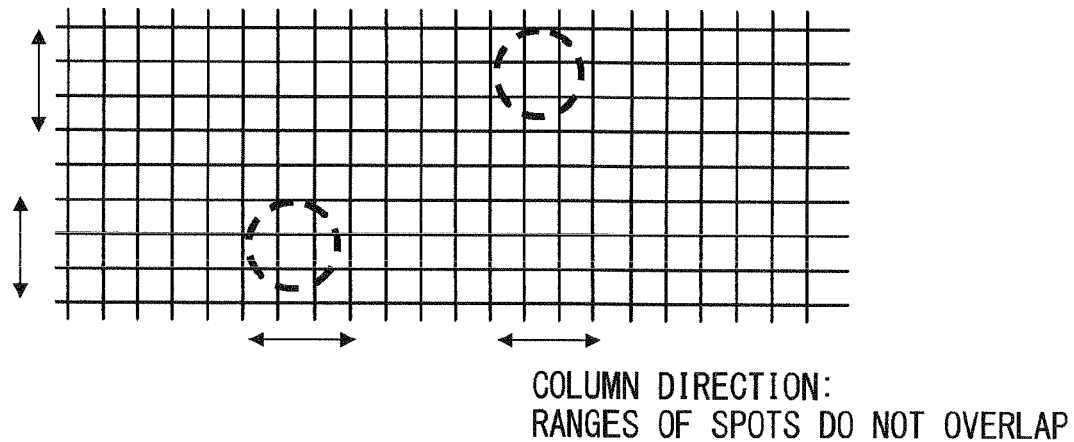
FIG. 20 is a schematic diagram (No. 2) illustrating a positional relationship between the spot lights from the two optical fibers.

FIGS. 19 and 20 are explanatory views of such distribution states of the spots on the pixel array. In FIG. 19, the two ranges of the spots overlap not in the column direction but in the row direction. In contrast, the ranges of the spots overlap neither in the column direction nor the row direction in FIG. 20.

In the second embodiment, the row selection is made in a similar manner as in the first embodiment as described with reference to FIGS. 16A to 17B. Search processes are started at the top and the bottom of the pixel array respectively. Each of the search processes is stopped when reaching the pixels illuminated by the spots of the optical signal. Accordingly, also pixels in the rows that are not illuminated by the two spots are turned on in the vicinity of the center of the pixel array in the state of FIG. 20. As a result, the number of rows in which pixels are turned on becomes too large, leading to an increase in the parasitic capacitance upon receipt of an optical signal.

Figure 21:
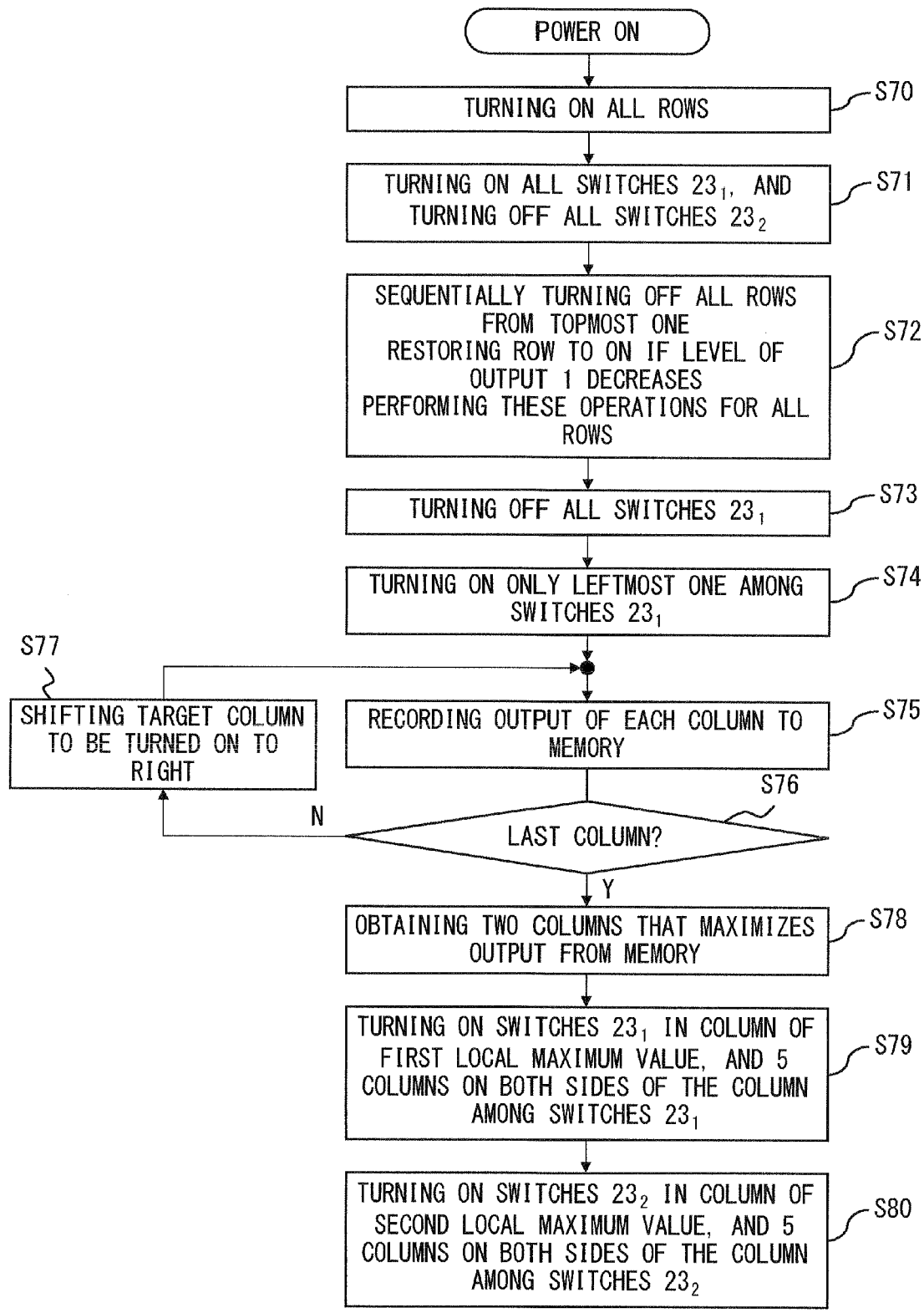
FIG. 21 is a flowchart illustrating process of a different row selection method used in the second embodiment.
Figure 22:
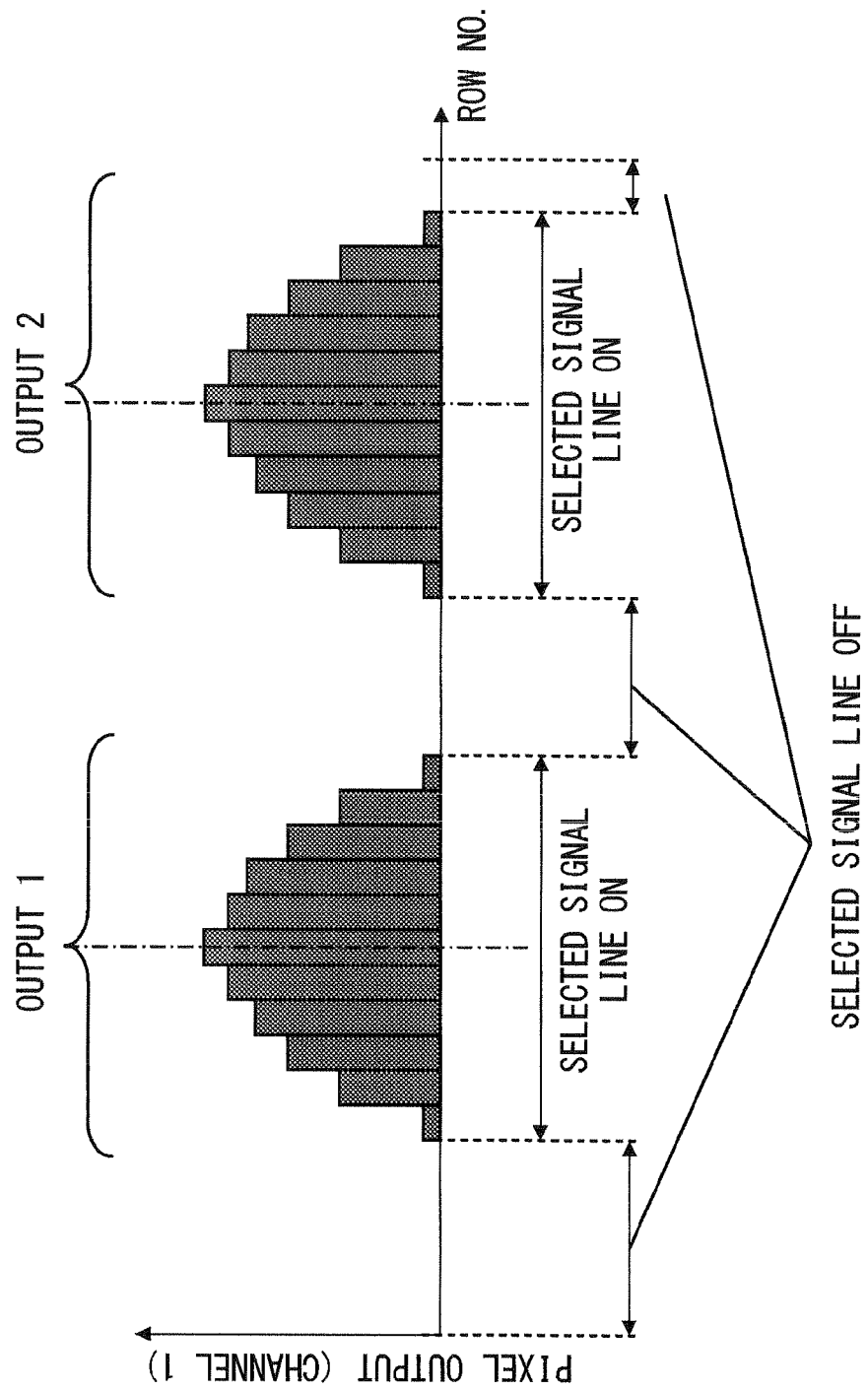
FIG. 22 is an explanatory view of the row selection method of FIG. 21.
Figure 23:
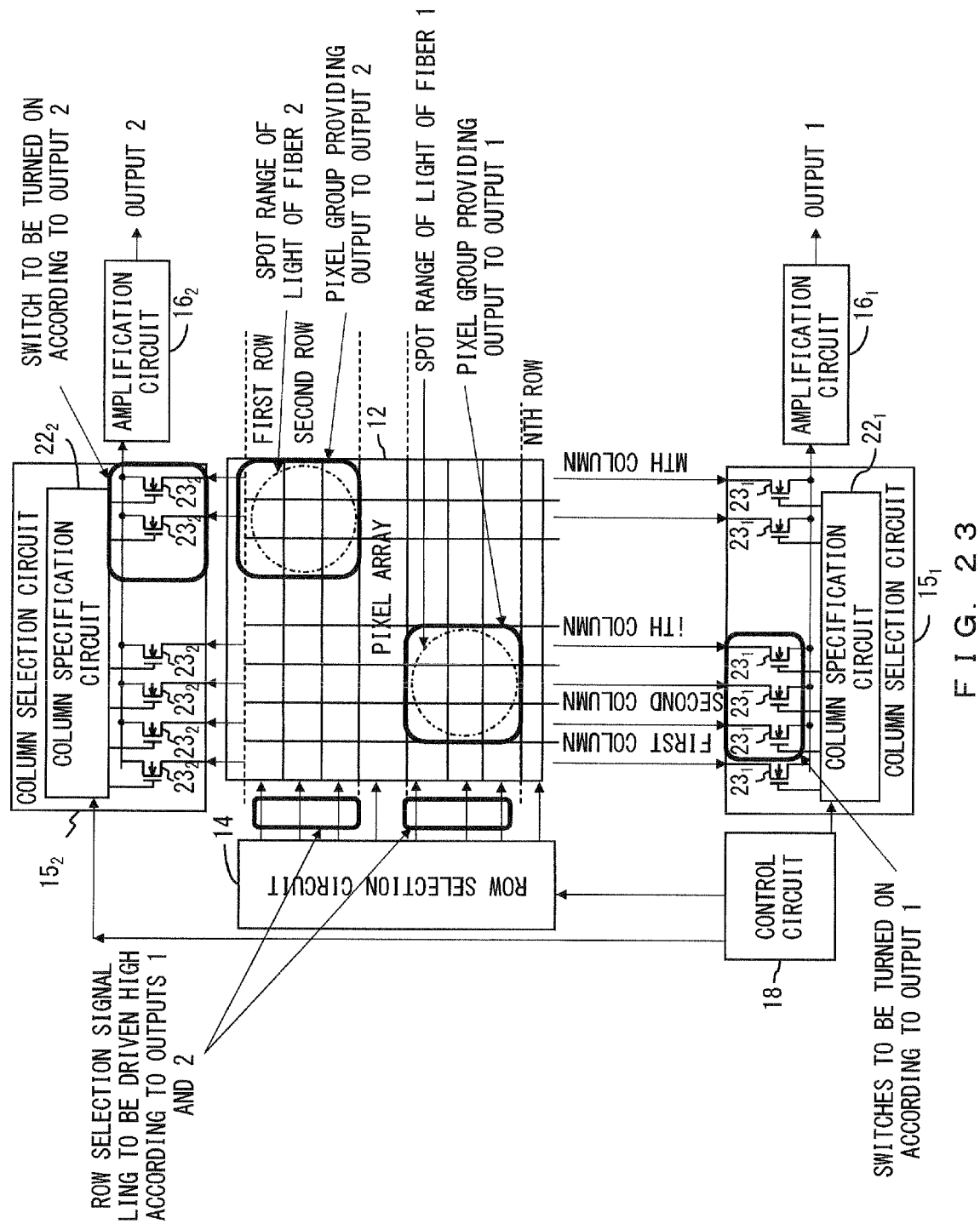
FIG. 23 is an explanatory view of a relationship between the ranges of light spots from two fibers and two outputs in the process of FIG. 21.

FIGS. 21 to 23 are explanatory views of a selection method for solving such a problem in the second embodiment. In steps S70 to S72 in the flowchart of FIG. 21, a process for properly turning off a row when the two spots do not overlap in rows, and the row in which pixels are to be turned off exists in the vicinity of the center of the two-dimensional pixel array as illustrated in FIG. 20 is executed.

Initially, the pixels in all the rows are turned on in step S70. Then, in step S71, all the MOS transistors $23_1$ within the row selection circuit 15, on the output 1 side of FIG. 16 are turned on, and all the MOS transistors $23_2$ within the row selection circuit $15_2$ are turned off. Then, in step S72, pixels start to be sequentially turned off at the topmost row among all the rows, and an operation for restoring pixels in a row turned off to ON is performed for all the rows if the level of the output 1 value decreases.

FIG. 22 is an explanatory view of pixel outputs when the row selection process that is executed as the processes in steps S70 to S72 is complete. Here, the output is assumed to be extracted from the channel 1, namely, the output 1 side. A waveform on the right side naturally corresponds to the output 2 as described with reference to FIG. 18. FIG. 22 represents that a selection signal for a row is turned off in rows in the vicinity of the center of the two-dimensional pixel array as described with reference to FIG. 20.

The column selection process is executed in steps S73 to S80 of FIG. 21. This column selection process is executed in a similar manner as in the first embodiment illustrated in FIG. 13. Namely, all the MOS transistors $23_1$ as the internal switches of the column selection circuit $15_1$ on the output 1 side are turned off in step S73. In step S74, only the switches $23_1$ corresponding to the leftmost column are turned on. In step S75, the output corresponding to the leftmost column, namely, the output 1 is recorded to the memory. Then, in step S76, whether or not the pixels in the last column are turned on is determined. Since the last column has not been turned on yet here, the processes in and after step S75 are repeated after a target column in which pixels are to be turned on is shifted to the right in step S77.

If the pixels in the last column are determined to be turned on in step S76, two columns that maximize the output are obtained from the memory in step S78. Then, in step S79, switches in the pixels in the column corresponding to the first local maximum value among the internal switches $23_1$ of the column selection circuit 15, and five columns on both sides of the above column are turned on in step S79. Then, the switches in the pixels in the column corresponding to the second local maximum value among the internal switches $23_2$ of the column selection circuit $15_2$ and five columns on both sides of the above column are turned on in step S80.

FIG. 23 is an explanatory view of pixel groups selected with the process of FIG. 21. Assume that the range of the spot of the light of the fiber 1 within the ribbon fiber exists on the lower left side of the pixel array 12, and the range of the spot of the light of the fiber 2 exists on the upper right side. In this case, it is proved that only the ranges of the spots of the light are properly selected not only for the columns but also for the rows with the process of FIG. 21, and the parasitic capacitance of the circuit for outputting an optical signal for each channel can be reduced.

Figure 24:
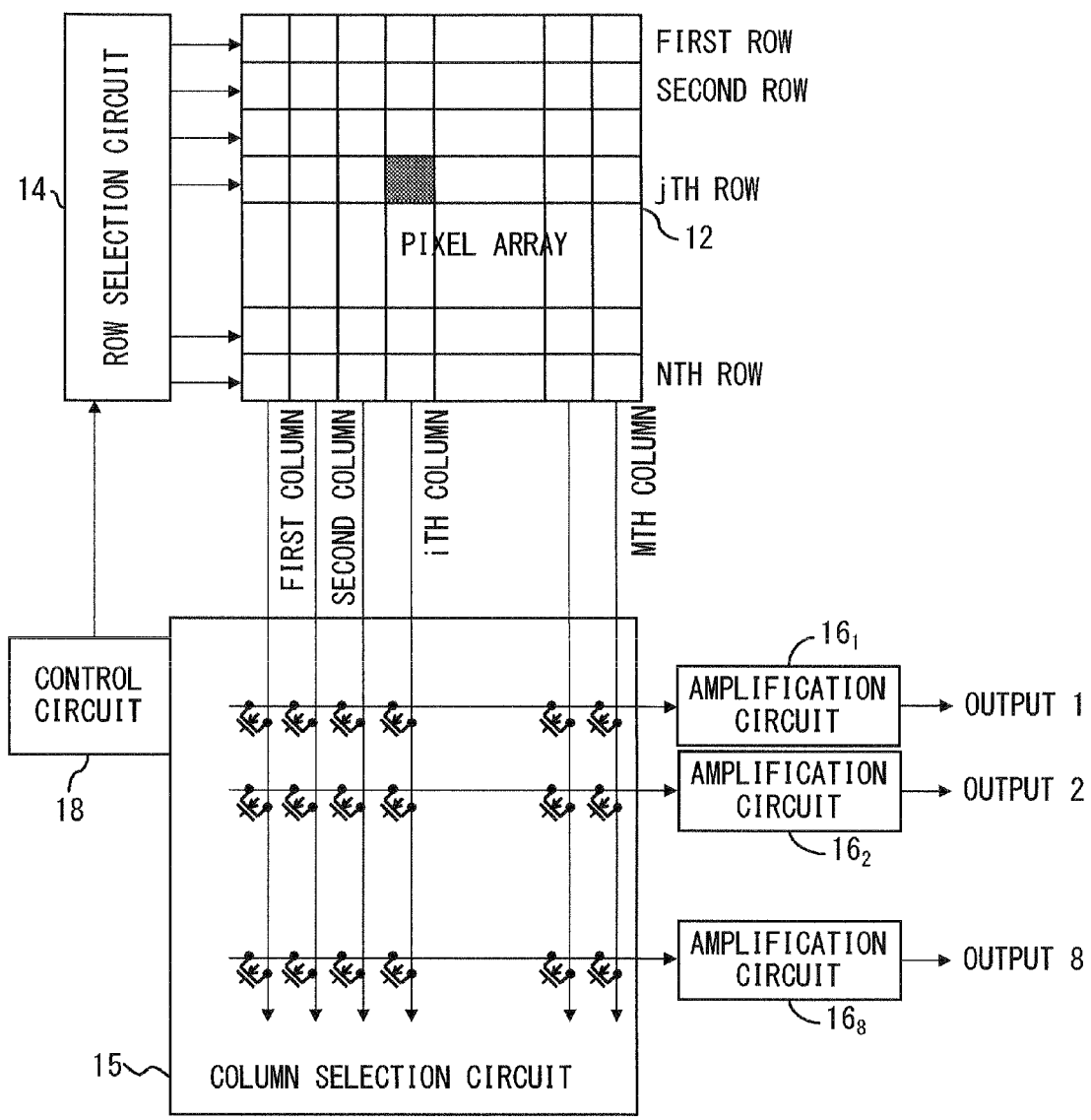
FIG. 24 is a block diagram illustrating a configuration of a third embodiment of the light receiving device.

FIG. 24 is a block diagram illustrating a configuration of a third embodiment of the light receiving device. The ribbon fiber is assumed to be composed of two fibers in the second embodiment. The third embodiment has a configuration where outputs of fibers are extracted as outputs 1 to 8 when the ribbon fiber is composed of a larger number of fibers, for example, eight fibers. FIG. 24 illustrates the configuration where MOS transistors for extracting the output of a pixel for each output are arranged in the horizontal direction within the column selection circuit 15, and currents from photodiodes within pixels in a selected column are gathered and input to amplification circuits $16_1$ to $16_8$.

FIG. 25 illustrates a configuration of a fourth embodiment of the light receiving device. Compared with the first embodiment of FIG. 6, in the fourth embodiment, an amplifier with a resistance IV conversion function is used as a replacement for the transimpedance amplifier as the amplification circuit 16 in FIG. 25. Any circuit is available as the amplification circuit 16 as far as it has the action of converting a current of an input of an addition result of currents output from photodiodes within selected pixels within the pixel array 12 into a voltage, and of amplifying the voltage. Generally, a transimpedance amplifier is widely used to amplify an optical signal. However, an amplifier with a resistance IV conversion function is naturally available as in the fourth embodiment.

Figure 26:
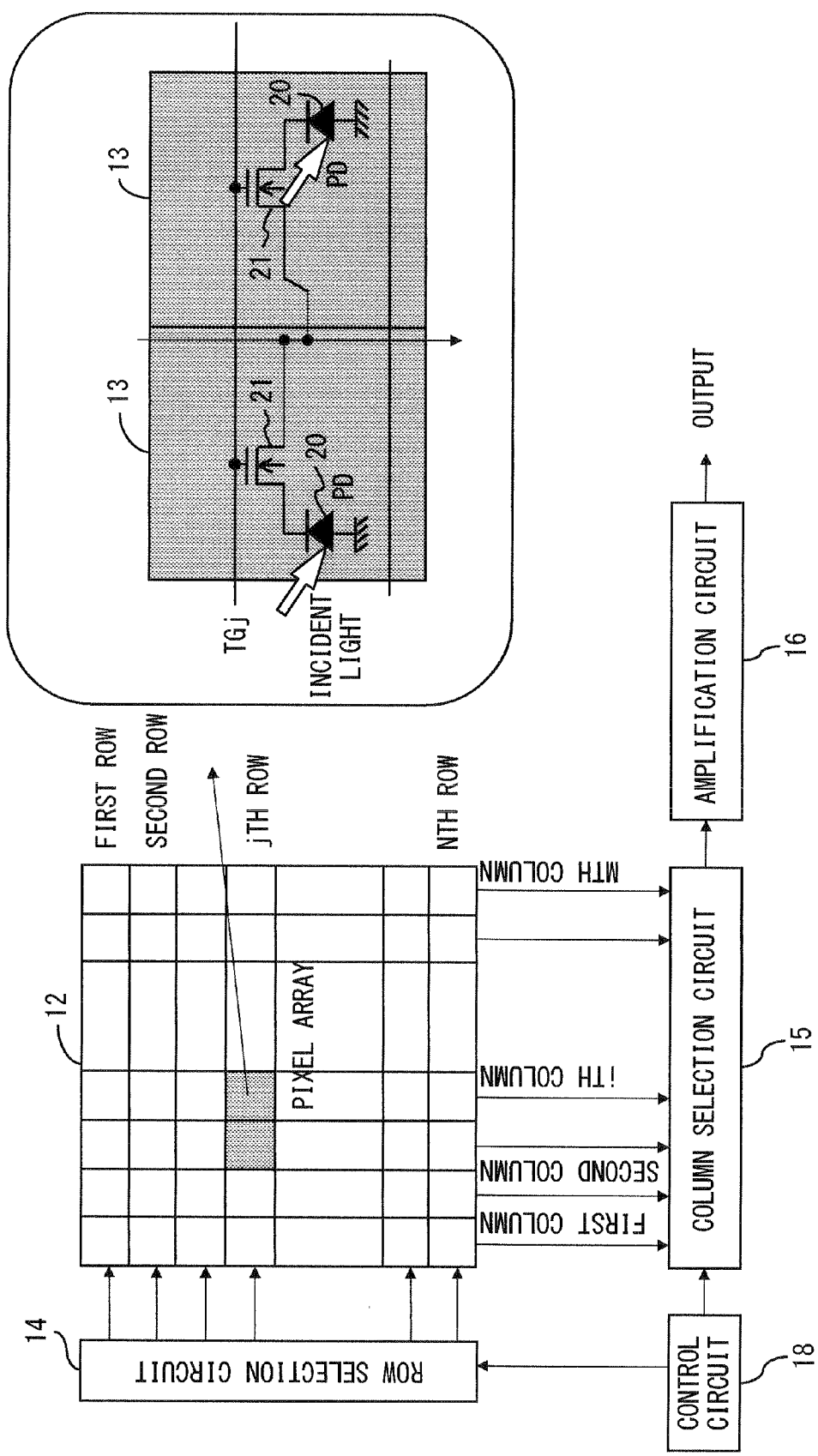
FIG. 26 is a block diagram illustrating a configuration of a fifth embodiment of the light receiving device.

FIG. 26 illustrates a fifth embodiment of the light receiving device. In the fifth embodiment, the number of column signal lines is reduced by causing the outputs of photodiodes within two pixels, two adjacent pixels here, to collectively output to one column signal line. By reducing the number of column signal lines in this way, the entire parasitic capacitance of signal lines can be decreased. However, compared with the state of using two column signal lines, the parasitic capacitance of a signal line is almost doubled by reducing the number of signal lines from two parallel lines to only one line. Therefore, whether or not to adopt the configuration of the fifth embodiment must be selected according to an actual configuration of the pixel array.

Figure 27:
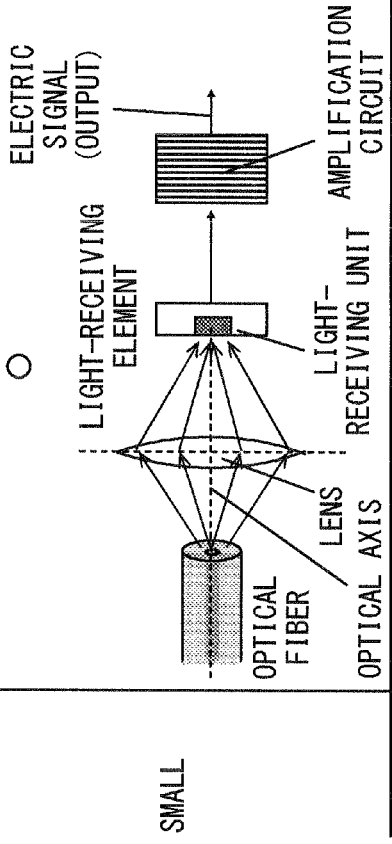
FIG. 27 is an explanatory view of differences between the embodiments and a conventional example.

The embodiments of the present invention have been described in detail above. Even if the misalignment of an optical axis occurs between an optical fiber and a light-receiving element in the embodiments, an optical signal can be received without decreasing the reception efficiency. FIG. 27 is an explanatory view of a comparison made between the conventional technology and the embodiments of the present invention. With the conventional method, an optical signal can be received without decreasing reception efficiency by gathering light from an optical fiber, for example, with a lens as illustrated in FIG. 27 if the misalignment of the optical axis is small. However, the light from the optical fiber cannot be properly received with the light-receiving element even with the lens if the misalignment of the optical axis becomes large.

In the meantime, in the embodiments of the present invention, an optical signal can be received with no use of a lens without decreasing the reception efficiency by selecting light-receiving elements in a range illuminated by a spot of light from an optical fiber even if the misalignment of an optical axis becomes large. In the embodiments, the amplification circuit is illustrated under the light-receiving element array. This is not intended for any particular purpose.

The embodiments using an n-channel MOS transistor as a switch that configures each pixel are described above. Therefore, the embodiments can be implemented by using a silicon photodiode, and the technology of CMOS composed of an n-channel MOSFET and a p-channel MOSFET on a silicon substrate. In this case, light of a wavelength range equal to or shorter than 1.0 μm, which can be received by the silicon photodiode, for example, light of a wavelength of 850 nm can be received.

However, the light receiving device according to an aspect of the invention can be also implemented by forming a photodiode, and an n-channel or p-channel MESFET or HEMT on a substrate of, for example, GaAs (Gallium Arsenide) or InP (Indium Phosphide) as a compound semiconductor.

Additionally, the above described embodiments refer to the configurations where a signal line from photodiodes as light-receiving elements is shared by pixels in one column, and the signal line is selected by the column selection circuit. However, a signal line from the light-receiving elements can be shared by one row, and the signal line can be selected with the row selection circuit as a matter of course. The embodiments and the pixel selection methods according to the embodiments are not limited to the above described examples, and various types of modifications can be made.

Furthermore, in the above described embodiments, signal light output from an optical fiber is assumed to be input to the pixel array as a spot of an optical signal not via a lens as illustrated in FIG. 3. Alternatively, the degree of precision of alignment of the optical axis can be further relieved by using a lens between the optical fiber and the pixel array. As a result, the mounting cost can be further reduced.

Also if the light receiving device according to an aspect of the invention is used as a pickup device for receiving signal light from an optical disk, etc., the degree of precision of alignment of an optical axis can be relieved. As a result, the mounting cost can be reduced. Moreover, the light receiving device according to an aspect of the invention can receive not only signals of a ribbon fiber including a plurality of optical fibers but also signals of an optical device that outputs a plurality of light beams, such as a light spatial modulator, an arrayed waveguide grating (AWG), or the like.

What is claimed is:

1. A light receiving device, comprising:
a two-dimensional array of pixels each having a light-receiving element for receiving input signal light;
a row selection unit which selects outputs of the two-dimensional pixel array in units of rows;
a column selection unit which selects the outputs of the two-dimensional pixel array in units of columns;
a selected output adding unit which adds and outputs the selected outputs of the pixels; and
a controller which searches a row or a column at which an added output becomes maximum and which controls the row selection unit and the column selection unit to select outputs of pixels in a plurality of peripheral rows or columns including the row or the column at which the added output becomes maximum, the added output being obtained by the selected output adding unit in units of columns or rows under the control of a selection of the row selection unit and a selection of the column selection unit to select outputs of pixels within the two-dimensional pixel array in units of columns or rows.

2. The light receiving device according to claim 1, further comprising
an amplifying unit which amplifies an output of the selected output adding unit.

3. The light receiving device according to claim 2, wherein the amplifying unit is configured with a transimpedance amplifier for converting an electric current as the output of the selected output adding unit into a voltage and for amplifying the voltage.

4. The light receiving device according to claim 2, wherein the amplifying unit is configured with a resistance type amplifier for converting an electric current as the output of the selected output adding unit into a voltage and for amplifying the voltage.

5. The light receiving device according to claim 1, wherein:
each of the pixels comprises a switch for outputting an output of the light-receiving element to a signal line shared by a column of the two-dimensional pixel array; and
the row selection unit selects the outputs of the two-dimensional pixel array in units of rows by turning on the switch in units of rows.

6. The light receiving device according to claim 5, wherein:
the selected output adding unit comprises a switch, for each column, for outputting each output of the signal line shared by each column to one signal line; and
the column selection unit selects the outputs of the two-dimensional pixel array in units of columns by turning on the switch for each column.

7. The light receiving device according to claim 1, wherein:
each of the pixels comprises a switch for outputting an output of the light-receiving element to a signal line shared by a plurality of columns of the two-dimensional pixel array; and
the row selection unit selects the outputs of the two-dimensional pixel array in units of rows by turning on the switch in units of rows.

8. The light receiving device according to claim 1, further comprising
a plurality of column selection units which respectively select the outputs of the two-dimensional pixel array in units of columns, wherein
the selected output adding unit comprises a plurality of column selected output adding units corresponding to the plurality of column selection units.

9. The light receiving device according to claim 8, further comprising
a plurality of amplifying units for respectively amplifying outputs of the plurality of column selected output adding units.

10. The light receiving device according to claim 8, wherein
the input signal light to the two-dimensional pixel array is light output from an optical fiber array.

11. The light receiving device according to claim 1, further comprising
a micro-lens for gathering the input signal light on a surface of each of the pixels that configure the two-dimensional pixel array.

12. The light receiving device according to claim 1, further comprising
a lens for gathering the input signal light and for providing the gathered light to the two-dimensional pixel array.

13. A light receiving method comprising:
receiving input signal light with a two-dimensional array of pixels each having a light-receiving element;
searching a pixel an output of which is not zero within the two-dimensional pixel array, and selecting outputs of pixels within the array, which correspond to a result of the searching; and
adding the selected outputs of the pixels and outputting an added result of the selected outputs of the pixels,
wherein:
a process in units of columns or rows is executed after a process in units of rows or columns is executed in the searching of the pixel, and the selecting of the outputs of the pixels; and
the selected outputs of the pixels are added after the process in units of columns or rows is executed, and wherein
in the process in units of rows or columns, and the process in units of columns or rows,
a row or a column an added output of which becomes maximum is searched, the added output being obtained in units of columns or rows when the outputs of pixels within the two-dimensional pixel array are selected in units of columns or rows, and
outputs of pixels in a plurality of peripheral rows or columns including the row or the column the added output of which becomes maximum are selected.

14. A light receiving method comprising:
receiving input signal light with a two-dimensional array of pixels each having a light-receiving element;
searching a pixel an output of which is not zero within the two-dimensional pixel array, and selecting outputs of pixels within the two-dimensional pixel array, which correspond to a result of the searching; and
adding the selected outputs of the pixels and outputting an added result of the selected outputs of the pixels,
wherein:
a process in units of columns or rows is executed after a process in units of rows or columns is executed in the searching of the pixel, and the selecting of the outputs of the pixels; and
the selected outputs of the pixels are added after the process in units of columns or rows is executed, and wherein
in the process in units of rows or columns, and the process in units of columns or rows,
a plurality of rows or columns a ratio of an added output of which to a maximum value of the added output becomes greater than a predetermined ratio are searched, the added output being obtained in units of columns or rows when the outputs of pixels within the two-dimensional pixel array are selected in units of columns or rows, and
outputs of pixels in a plurality of peripheral rows or columns including the plurality of rows or columns the ratio of the added output of which to the maximum value of the added output becomes greater than the predetermined ratio are selected.

15. A light receiving device, comprising:
a two-dimensional array of pixels each having a light-receiving element for receiving input signal light;
a row selection unit which selects outputs of the two-dimensional pixel array in units of rows;
a column selection unit which selects the outputs of the two-dimensional pixel array in units of columns;
a selected output adding unit which adds and outputs the selected outputs of the pixels; and
a controller which searches a row or a column at which a ratio of an added output to a maximum value of the added output becomes greater than a predetermined ratio and which controls the row selection unit and the column selection unit to select outputs of pixels in a plurality of peripheral rows or columns including the plurality of the rows or the columns at which the added output of the plurality of rows or columns becomes greater than a predetermined ratio, the added output being obtained by the selected output adding unit in units of columns or rows under the control of a selection of the row selection unit and a selection of the column selection unit to select outputs of pixels within the two-dimensional pixel array in units of columns or rows.

* * * * *